(12) United States Patent
Iwamatsu et al.

(10) Patent No.: US 6,479,330 B2
(45) Date of Patent: Nov. 12, 2002

(54) SEMICONDUCTOR DEVICE AND METHOD FOR MANUFACTURING THE SAME

(75) Inventors: Toshiaki Iwamatsu, Tokyo (JP); Takashi Ipposhi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/922,812

(22) Filed: Aug. 7, 2001

(65) Prior Publication Data

US 2002/0009837 A1 Jan. 24, 2002

Related U.S. Application Data

(62) Division of application No. 09/055,300, filed on Apr. 6, 1998.

(30) Foreign Application Priority Data

Jun. 24, 1997 (JP) .............................................. 9-167500
Nov. 21, 1997 (JP) .............................................. 9-321381

(51) Int. Cl.$^7$ ................................................. H01L 21/00
(52) U.S. Cl. ........................ 438/151; 438/294; 438/454
(58) Field of Search ................. 438/151, 294, 438/454, 439

(56) References Cited

U.S. PATENT DOCUMENTS

| | | | |
|---|---|---|---|
| 3,869,786 A | | 3/1975 | Adam |
| 5,164,806 A | * | 11/1992 | Nagatomo et al. .......... 257/395 |
| 5,440,161 A | | 8/1995 | Iwamatsu et al. |
| 5,606,188 A | * | 2/1997 | Bronner et al. ............. 257/301 |
| 5,652,454 A | | 7/1997 | Iwamatsu et al. |
| 5,652,458 A | | 7/1997 | Ahn |
| 5,828,120 A | * | 10/1998 | Ishikawa .................... 257/401 |
| 5,869,376 A | * | 2/1999 | Tomioka ..................... 438/304 |
| 5,889,335 A | | 3/1999 | Kuroi |
| 6,150,696 A | | 11/2000 | Iwamatsu et al. |
| 6,191,450 B1 | | 2/2001 | Maeda et al. |
| 6,198,134 B1 | * | 3/2001 | Inoue et al. ................. 257/347 |

FOREIGN PATENT DOCUMENTS

| | | | |
|---|---|---|---|
| JP | 56-104446 | 8/1981 | |
| JP | 57-36842 | 2/1982 | |
| JP | 2-137335 | 5/1990 | |
| JP | 6-204237 | 7/1994 | |
| JP | 07273185 A | * 10/1995 | ........... H01L/21/76 |
| JP | 0813295 A | * 5/1996 | ......... H01L/27/108 |
| JP | 8-130295 | 5/1996 | |

OTHER PUBLICATIONS

US 6,091,158, 7/2000, Iwamatsu (withdrawn)
T. Iwamatsu, et al., "Cad—Compatible High–Speed CMOS/SIMOX Gate Array Using Field–Shield Isolation", IEEE Transactions on Electron Devices, vol. 42, No. 11, Nov. 1995, pp. 1934–1939.
U. S. patent application Ser. No. 09/667,498, filed Sep. 22, 2000.
U. S. patent application Ser. No. 09/922,812, filed Aug. 7, 2001, pending.

\* cited by examiner

*Primary Examiner*—John F. Niebling
*Assistant Examiner*—Stacy A Whitmore
(74) *Attorney, Agent, or Firm*—Oblon, Spivak, McClelland, Maier & Neustadt, P.C.

(57) ABSTRACT

At an edge portion of an FS gate electrode (10) beneath a side wall oxide film (106), an FS gate oxide film (101) is thicker. Relative to a surface of a silicon substrate (SB) beneath the FS gate oxide film (101), other surface of the silicon substrate (SB) is retracted. Thus, a MOS transistor with field-shield isolation structure and a method for manufacturing the same can be provided with higher reliability of the gate oxide film.

11 Claims, 40 Drawing Sheets

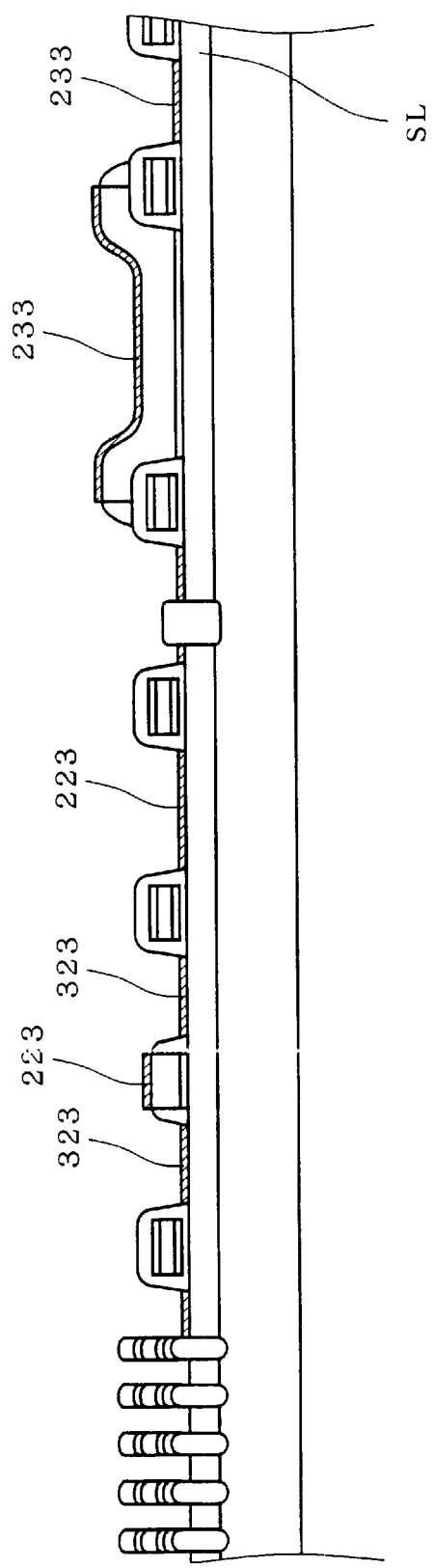

F I G. 4 3
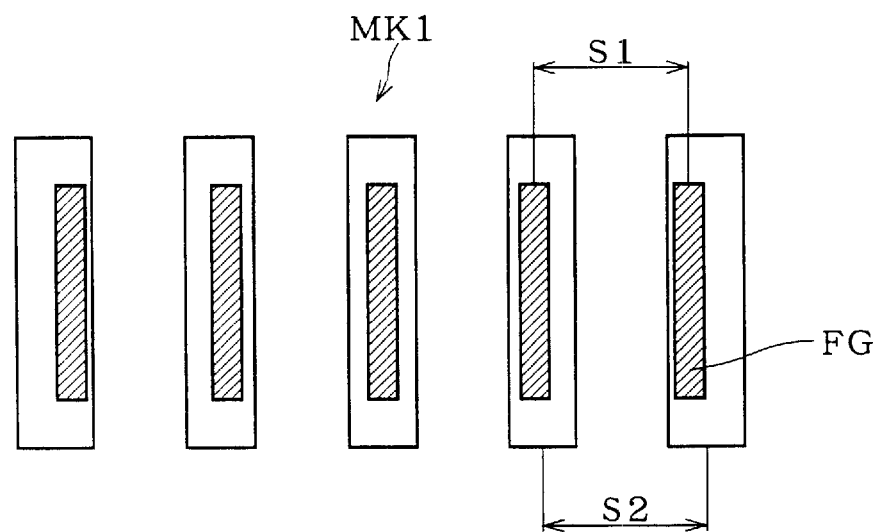
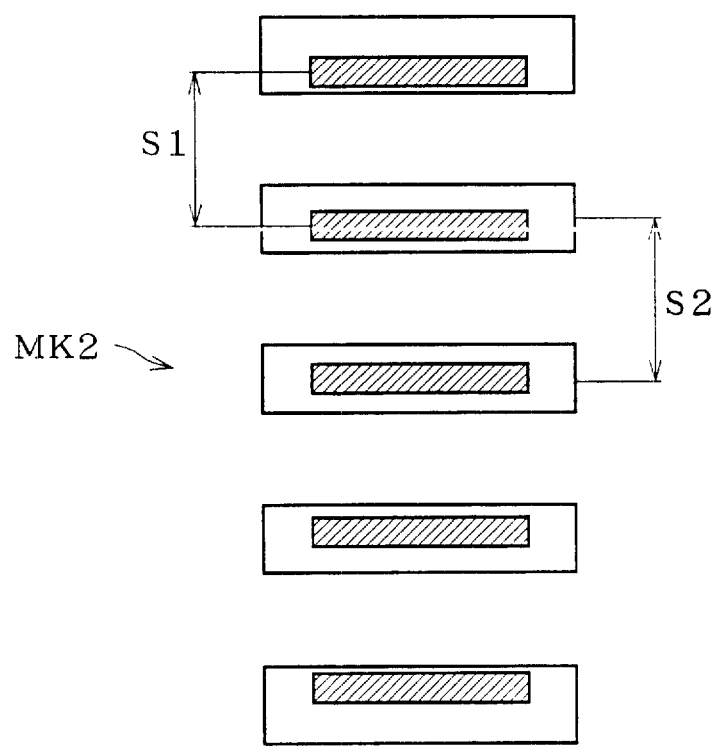

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same, and more particularly to a semiconductor device with field-shield isolation structure and a method for manufacturing the same.

2. Description of the Background Art

FIG. 44 is a plan view of a background-art semiconductor device with field-shield isolation structure. In this figure, defining an active region AR of a MOS transistor, a field-shield (FS) gate electrode 1 is formed like a rectangular ring to make a field-shield isolation structure and a gate electrode 2 of the MOS transistor is formed above the FS gate electrode 1 so as to halve the FS gate electrode 1.

The active regions AR externally located on both sides of the gate electrode 2 are regions to serve as source/drain (S/D) regions 3 and above the S/D regions 3, S/D electrodes 4 mainly made of aluminum are formed. A plurality of contact holes 5 are formed between the S/D regions 3 and the S/D electrodes 4.

Further, insulating layers are provided between the FS gate electrode 1 and the gate electrode 2 and between the S/D region 3 and the S/D electrode 4, but not shown in this figure, for convenience of illustration, to allow main elements to be clearly seen.

FIG. 45 is a cross section taken along the lines A—A of FIG. 44, showing a construction of the MOS transistor and the FS gate electrode formed on a bulk silicon substrate.

In this figure, the gate electrode 2 is formed on a surface of a silicon substrate SB. The gate electrode 2 has a gate oxide film 21 formed on the surface of the silicon substrate SB, a polysilicon layer 22 formed on the gate oxide film 21 and a salicide layer 23 formed on the polysilicon layer 22, and side wall oxide films 24 are formed on the side surfaces of these film and layers. In the surface of the silicon substrate SB outside each side of the gate electrode 2, an S/D layer 31 and a lightly doped drain (LDD) layer 32 which constitute the S/D region 3 are provided. A salicide layer 33 covers the surface of the S/D layer 31.

On the surface of the silicon substrate SB outside the S/D region 3, the FS gate electrode 1 is formed. The FS gate electrode 1 has an FS gate oxide film 11 formed on the surface of the silicon substrate SB, a polysilicon layer 12 formed on the FS gate oxide film 11 and an FS upper oxide film 13 formed on the polysilicon layer 12, and side wall oxide films 14 are formed on the side surfaces of these films and layer. Furthermore, in some cases, the construction of the FS gate electrode 1 is referred to as a field-shield isolation structure and the polysilicon layer 12 is referred to as an FS gate electrode.

An interlayer insulating film 9 is formed so as to cover the FS gate electrode 1, the gate electrode 2 and the S/D region 3. A contact hole 5 is formed, penetrating the interlayer insulating film 9 between the S/D region 3 and the S/D electrode 4 and filled with conductor, to thereby electrically connect the S/D region 3 and the S/D electrode 4 to each other.

Next, with reference to FIGS. 46 to 51, a manufacturing process will be discussed. First, the FS gate oxide film 11, the polysilicon layer 12 and the FS upper oxide film 13 are layered on the silicon substrate SB (implanted with channel) in this order. With a resist mask R1, a patterning is performed on the multiple layers as shown in FIG. 46, to form the FS gate electrode 1. The FS gate oxide film 11 is formed by CVD (=Chemical Vapor Deposition) at the temperature of 700° C. to have a thickness of 100 to 1000 Å. The polysilicon layer 12 is formed by CVD at the temperature of 600 to 800° C. to have a thickness of 100 to 1000 Å. The polysilicon layer 12 is implanted with phosphorus (P) of about $1\times10^{20}/cm^3$ as impurity. The FS upper oxide film 13 is formed by CVD, for example, at the temperature of 700° C. to have a thickness of 500 to 2000 Å.

In the step of FIG. 47, after removing the resist mask R1, the side wall oxide film 14 is formed. The process for forming the side wall oxide film 14 is as follows: an oxide film is formed so as to cover the FS gate electrode 1 and then the oxide film is selectively removed by anisotropic etching (dry etching), to form the side wall oxide film 14 being self-aligned. In this case, however there is a problem of damage due to the anisotropic etching left at a region X on the surface of the silicon substrate SB in FIG. 47. This problem will be discussed later in detail with reference to FIGS. 56 and 57.

Subsequently, the gate oxide film 21 is formed on the surface of the silicon substrate SB and the polysilicon layer 22 is formed so as to cover the gate oxide film 21 and the FS gate electrode 1. Then, as shown in FIG. 48, a resist mask R2 is formed at a predetermined position on the polysilicon layer 22 and a patterning is performed on the polysilicon layer 22 through the resist mask R2.

In the step of FIG. 49, with the polysilicon layer 22 used as a mask, the LDD layer 32 is formed, being self-aligned, by ion implantation. In this ion implantation, arsenic (As) or phosphorus (P) is injected at an energy of 30 to 70 KeV at a dose of $1\times10^{13}$ to $4\times10^{14}/cm^2$. The ion injection should be continuously performed at an injection angle of 45° to 60°, with the silicon substrate rotated.

Subsequently, as shown in FIG. 50, the side wall oxide film 24 is formed on the side wall of the gate electrode 2. The process for forming the side wall oxide film 24 is as follows: an oxide film having a thickness of 500 to 800 Å is formed so as to cover the gate electrode 2 and then the oxide film is selectively removed by anisotropic etching (dry etching), to form the side wall oxide film 24 being self-aligned.

After that, with the FS gate electrode 1 and the gate electrode 2 used as a mask, the S/D layer 31 is formed by ion implantation. In this ion implantation, arsenic (As) or phosphorus (P) is injected at an energy of 30 to 70 KeV at a dose of $4\times10^{14}$ to $7\times10^{15}/cm^2$.

Subsequently, as shown in FIG. 51, the salicide films 23 and 33 are formed, being self-aligned, only on the upper surface of the gate electrode 2 and the surface of the S/D region 3. These salicide films 23 and 33 may be any of cobalt silicide, titanium silicide, tungsten silicide or the like.

After that, the interlayer insulating film 9 is formed so as to cover the FS gate electrode 1, the gate electrode 2 and S/D region 3, the contact hole 5 is formed so as to penetrate the interlayer insulating film 9 on the S/D region 3 and filled with the conductor, and the S/D electrode 4 mainly made of aluminum is formed thereon, to obtain the background art semiconductor device with field-shield isolation structure as shown in FIGS. 44 and 45.

Next, a cross section taken along the lines B—B of FIG. 44 is shown in FIG. 52. In this figure, the gate oxide film 21 is formed on the surface of the silicon substrate SB between two FS gate electrodes 1, and the polysilicon layer 22 is formed so as to cover the gate oxide film 21 and the FS gate electrodes 1. Further, the salicide film 23 is formed on the polysilicon layer 22. Furthermore, in the silicon substrate SB beneath the gate oxide film 21, a channel region is created when the device operates.

The interlayer insulating film 9 is formed so as to cover the FS gate electrode 1, the gate electrode 2 and the S/D region 3, and the contact hole 5 is formed so as to penetrate the interlayer insulating film 9 located on the end portion of the gate electrode 2 and filled with the conductor, to connect the gate electrode 2 and a gate interconnection layer 6.

A manufacturing process will be discussed below with reference to FIGS. 53 to 55. First, the FS gate oxide film (field-shield oxide film) 11, the polysilicon layer 12 and the FS upper oxide film 13 are layered on the silicon substrate SB in this order. With the resist mask R1, a patterning is performed on the multiple layers as shown in FIG. 53, to form the FS gate electrode 1. This step is the same as that of FIG. 46, so redundant discussion is omitted.

In the step of FIG. 54, after removing the resist mask R1, the side wall oxide film 14 is formed. The process for forming the side wall oxide film 14 is as follows: an oxide film is formed so as to cover the FS gate electrode 1 and then the oxide film is selectively removed by anisotropic etching (dry etching), to form the side wall oxide film 14 being self-aligned.

In this step, the damage due to the anisotropic etching is left at a region Y on the surface of the silicon substrate SB in FIG. 54. This damage is the same as that at the region X of FIG. 47. This problem will be discussed later in detail with reference to FIGS. 56 and 57.

Subsequently, in the step of FIG. 55, the gate oxide film 21 is formed on the surface of the silicon substrate SB, and the polysilicon layer 22 which is a body of the gate electrode 2 is formed so as to cover the gate oxide film 21 and the FS gate electrode 1. This step for forming the polysilicon layer 22 is the same as that of FIG. 48, so redundant discussion is omitted. In this case, a defect is caused at a region Z of FIG. 55 by the damage at the region Y on the surface of the silicon substrate SB in FIG. 54. This problem will be discussed later in detail with reference to FIG. 58.

Then, as discussed with reference to FIG. 51, the salicide films 23 and 33 (not shown) are formed, being self-aligned, only on the upper surface of the gate electrode 2 and the surface of the S/D region 3 (not shown). The interlayer insulating film 9 is formed so as to cover the FS gate electrode 1 and the gate electrode 2, and the contact hole 5 is formed so as to penetrate the interlayer insulating film 9 located on the end portion of the gate electrode 2 and filled with the conductor, and the gate interconnection layer 6 mainly made of aluminum is formed thereon, to obtain the background-art semiconductor device with field-shield isolation structure as shown in FIGS. 44 and 45.

The following prior-art documents on the field-shield gate have been found by searching. Outlines thereof will be presented below.

In Japanese Patent Application Laid Open Gazette 7-273185 disclosing a construction intended to avoid bloating of end portions of a shield gate oxide film, no description is found on any construction in which a surface of a semiconductor substrate on which a MOS transistor is formed is located lower than a surface of the semiconductor substrate on which a field-shield oxide film is formed and its action and effect.

In Japanese Patent Application Laid Open Gazettes 2-137335 and 6-204237 disclosing a construction in which end portions of a gate oxide-film are thicker, no reference is made to the thickness of edge portions of a field-shield oxide film, and no description is round on any construction in which a surface of a semiconductor substrate on which a MOS transistor is formed is located lower than a surface of the semiconductor substrate on which the field-shield oxide film is formed and its action and effect.

In Japanese Patent Application Laid Open Gazettes 56-104446 and 57-36842 disclosing a construction in which a semiconductor layer for isolation has higher impurity concentration, no reference is made to the problems inherent in the SOI (Silicon-On-Insulator) substrate, and no description is found on any construction in which a surface of a semiconductor substrate on which a MOS transistor is formed is located lower than a surface of the semiconductor substrate on which a field-shield oxide film is formed and its action and effect of lowering the electric resistance of an SOI layer beneath a field-shield gate electrode.

Having the above construction and manufactured by the above method, the background-art semiconductor device with field-shield isolation structure has the following problem.

FIG. 56 illustrates the structure at the region X of FIG. 47 and the region Y of FIG. 54 in detail. In this figure shown is a state immediately after the side wall oxide film 14 is formed on the side surface of the FS gate electrode 1 by anisotropic etching (dry etching).

When the side wall oxide film 14 is formed, for excellent directivity in anisotropic etching, dry etching is adopted, which may cause overetching that removes the surface of the silicon substrate SB.

Especially, at an edge portion of the side wall oxide film 14, more silicon is removed than at other portions and as a result the silicon substrate SB is partially scooped out. One of the factors that cause this phenomenon is locally-unequal density of an etchant. Thus, a dent portion DP is created on the surface of the silicon substrate SB near the edge portion of the side wall oxide film 14 as shown in FIG. 56.

After the step of forming the side wall oxide film 14, a natural oxide film formed on the surface of the silicon substrate SB must be removed by wet etching prior to forming the late oxide film 21 on the surface of the silicon substrate SB as discussed with reference to FIG. 48. At this time, together with the natural oxide film, the FS upper oxide film 13 and the side wall oxide film 14 are slightly removed. This state is shown in FIG. 57.

In this figure, the broken line indicates where the FS upper oxide film 13 and the side wall oxide film 14 were formed before removing the natural oxide film. As is clear from FIG. 57, an edge portion EP is created in the periphery of the side wall oxide film 14 as the FS upper oxide film 13 and the side wall oxide film 14 are retracted.

FIG. 58 shows a state after forming the gate oxide film 21 and the polysilicon layer 22 in this condition. This figure is a detailed view of the region Z of FIG. 55.

As shown in FIG. 58, the gate oxide film 21 is formed over the edge portion EP. The gate oxide film 21 is thin, having a thickness of about 50 to 100 Å, and in some cases, that on the edge portion EP is thinner. Further, at the edge portion EP, electric field is more intense due to electric field concentration. This, along with thinness of the gate oxide film 21, may cause breaking of the gate oxide film 21 with high possibility.

That results in less reliability of the gate oxide film and by extension, of the MOS transistor with field-shield isolation structure. Furthermore, the MOS transistor with field-shield isolation structure on an SOI substrate has the same problem.

Though the brief discussion has been made, in the SOI substrate or the bulk silicon substrate, channel injection is performed before forming the S/D layer and the LDD layer. In the channel injection, the background-art method has the following problem. The problem in the channel injection will be discussed below with reference to FIGS. 59 to 64, taking a process for manufacturing a CMOS transistor with field-shield isolation structure on the SOI substrate as an example.

As shown in FIG. 59, the FS gate electrode 1 is formed on the SOI substrate OB, and the SOI substrate OB is separated into the NMOS transistor formation region NR and the PMOS transistor formation region PR. At this time, a mask alignment mark AL of the same configuration as the FS gate electrode 1 is also formed. Further, the SOI substrate OB consists of the insulating substrate including the silicon substrate SB and the buried oxide layer OX formed thereon, and the SOI layer (single crystalline silicon layer) SL formed on the insulating substrate.

Furthermore, as discussed earlier, there arises a problem that with formation of the FS gate electrode 1, the SOI layer SL is scooped out near the edge portion of the side wall oxide film 14.

Next, in the step of FIG. 60, a resist mask R3 is formed in the NMOS transistor formation region NR, and a channel is injected into the PMOS transistor formation region PR to form a channel injection region CDP. This injection is performed with phosphorus ion, for example.

Subsequently, in the step of FIG. 61, a resist mask R4 is formed in the PMOS transistor formation region PR, and a channel is injected into the NMOS transistor formation region NR to form a channel injection region CDN. This injection is performed with boron ion, for example. The mask alignment mark AL is used to align the positions for forming the resist masks R3 and R4.

The state after the channel injection near the FS gate electrode 1 is shown in FIG. 62. The injected impurity (P or B) has an injection peak at the position indicated by the broken line IP, as shown in FIG. 62. Specifically, the impurity has the injection peak at the middle position in the SOI layer SL on which no FS gate electrode 1 is formed and has the peak inside the polysilicon layer 12 in the FS gate electrode 1. This distribution is caused by the injection at an energy suitable for the SOI layer SL. To inject the channel also into the SOI layer SL beneath the FS gate electrode 1, it is necessary to perform the ion injection at higher energy. The state after this injection is shown in FIG. 63.

As indicated by the broken line IP of FIG. 63, the injected impurity (P or B) has an injection peak in the SOI layer SL beneath the FS gate electrode 1 and in the buried oxide layer OX of the insulating substrate on which no FS gate electrode 1 is formed.

The channel injection region obtained by the above two ion injection is shown in FIG. 64. As shown in FIG. 64, channel injection regions CD1 and CD2 each having an almost-desired concentration are formed in the SOI layer SL on which no FS gate electrode 1 is formed and in the SOI layer SL beneath the FS gage electrode 1, respectively, but the impurity in the SOI layer SL beneath the side wall oxide film 14 does not have the desired concentration.

Thus, since the channel injection is performed after forming the FS gate electrode 1 in the background art, the channel has to go through the FS gate electrode 1 at higher energy if it is required that the channel should be injected also into the semiconductor layer beneath the FS gate electrode 1. Therefore, when the SOI substrate OB is used, there is a possibility that the impurity may be injected also into the buried oxide layer OX in the portion where no FS gate electrode 1 is formed, and on the other hand, the impurity beneath the side wall oxide film 14 of the FS gate electrode 1 can not have the desired concentration.

SUMMARY OF THE INVENTION

The present invention is directed to a semiconductor device. According to a first aspect of the present invention, the semiconductor device comprises: a field-shield isolation structure for electrically isolating MOS transistors, and the field-shield isolation structure includes a field-shield oxide film formed on a semiconductor substrate; and a field-shield gate electrode formed on the field-shield oxide film. In the semiconductor device of the first aspect, an edge portion of the field-shield oxide film is thicker than a central portion thereof, and a surface of the semiconductor substrate on which each of the MOS transistors is formed is located lower than a surface of the semiconductor substrate on which the field-shield oxide film is formed.

According to a second aspect of the present invention, in the semiconductor device of the first aspect, the semiconductor substrate is an SOI substrate having an SOI layer formed on an insulating substrate, and the field-shield isolation structure and each of the MOS transistors are formed on the Sol layer.

According to a third aspect of the present invention, in the semiconductor device of the second aspect, an impurity concentration in the SOI layer beneath the field-shield gate electrode is higher than that in a channel region of each of the MOS transistors formed in the SOI layer.

According to a fourth aspect of the present invention, in the semiconductor device of the second aspect, the channel region of each of the MOS transistors formed in the SOI layer has an impurity of a first conductivity type having a first concentration and an impurity of a second conductivity type having a second concentration which is lower than the first concentration, and a concentration of an impurity of the first conductivity type in the SOI layer beneath the field-shield gate electrode is almost equal to the first concentration.

According to a fifth aspect of the present invention, in the semiconductor device of the first aspect, the field-shield isolation structure further includes a first insulating film with resistance to oxidation formed between the field-shield oxide film and the field-shield gate electrode; and a second insulating film with resistance to oxidation formed directly on the field-shield gate electrode.

According to a sixth aspect of the present invention, the semiconductor device of the first aspect further comprises: superimposition check marks provided on the semiconductor substrate, being used for alignment in forming the field-shield isolation structure. In the semiconductor device of the sixth aspect, the field-shield isolation structure is selectively formed on each of the superimposition check marks.

According to a seventh aspect of the present invention, in the semiconductor device of the sixth aspect, the superimposition check marks are made of a plurality of LOCOS oxide layers independent of one another, the plurality of LOCOS oxide layers have a first group of LOCOS oxide layers arranged in a first direction, and a second group of LOCOS oxide layers arranged in a second direction which is perpendicular to the first direction, and the field-shield isolation structure is formed independently on each of the plurality of LOCOS layers.

The present invention is also directed to a method for manufacturing a semiconductor device. The semiconductor device comprises a field-shield isolation structure for electrically isolating MOS transistors, and the field-shield isolation structure includes a field-shield oxide film formed on a semiconductor substrate; and a field-shield gate electrode formed on the field-shield oxide film. According to an eighth aspect of the present invention, the method comprises the steps of: (a) preparing the semiconductor substrate; (b) selectively forming the field-shield oxide film and the field-shield gate electrode on the semiconductor substrate and thereafter forming side wall oxide films on side walls of the field-shield gate electrode; and (c) forming a sacrifice oxide film on an exposed surface of the semiconductor substrate and removing the sacrifice oxide film.

According to a ninth aspect of the present invention, in the method of the eighth aspect, the step (a) is the step of preparing an SOI substrate having an SOI layer formed on an insulating substrate, and the field-shield oxide film and the sacrifice oxide film are formed on the SOI layer.

According to a tenth aspect of the present invention, in the method of the ninth aspect, the step (a) includes the step of performing ion injection with an impurity of a first conductivity type into the SOI layer so that the impurity of the first conductivity type has a first concentration, and the step (c) includes the step of (c-1) performing ion injection, after forming the sacrifice oxide film, with an impurity of a second conductivity type into the SOI layer through the sacrifice oxide film so that the impurity of the second conductivity type has a second concentration which is lower than the first concentration.

According to an eleventh aspect of the present invention, in the method of the ninth aspect, the step (a) includes the step of performing ion injection with an impurity of a first conductivity type into the SOI layer so that the impurity of the first conductivity type has a first concentration, and the step (b) includes the step of (b-1) performing ion injection, before forming the side wall oxide films, with an impurity of a second conductivity type into the SOI layer by using the field-shield gate electrode as a mask so that the impurity of the second conductivity type has a second concentration which is lower than the first concentration.

According to a twelfth aspect of the present invention, in the method of the eleventh aspect, the step (b) includes the steps of (b-2) entirely forming the field-shield oxide film and the field-shield gate electrode and (b-3) selectively removing the field-shield gate electrode, and the steps (b-2) and (b-3) are performed before the step (b-1).

According to a thirteenth aspect of the present invention, the method of the eighth aspect further comprises the step of: selectively forming an LOCOS oxide layer at a predetermined position on a surface of the semiconductor substrate before the step of (b). In the method of the thirteenth aspect, the step (b) includes the step of (b-4) forming a resist mask on the field-shield oxide film and the field-shield gate electrode and selectively removing the field-shield oxide film and the field-shield gate electrode by etching, and the LOCOS oxide layer is used as a superimposition check mark in forming the resist mask.

According to a fourteenth aspect of the present invention, in the method of the eighth aspect, the step (b) includes the steps of (b-5) forming a first insulating film with resistance to oxidation so as to be interposed between the field-shield oxide film and the field-shield gate electrode; and (b-6) forming a second insulating film with resistance to oxidation directly on the field-shield gate electrode.

According to a fifteenth aspect of the present invention, in the method of the eighth aspect, the field-shield oxide film is formed by CVD.

In the semiconductor device of the first aspect, since the edge portion of the field-shield oxide film is thicker than the central portion thereof, it is possible to prevent dielectric breakdown at the edge portion where electric field concentration is liable to occur and therefore the reliability of the field-shield isolation structure is increased. Moreover, since the surface of the semiconductor substrate on which the MOS transistor is formed is located lower than the surface of the semiconductor substrate on which the field-shield oxide film is formed, it is possible to widen the distance between the gate electrode of the MOS transistor and the interconnection layer provided above the MOS transistor and reduce the parasitic capacitance therebetween, and therefore a semiconductor device with faster operation and less power consumption can be provided.

In the semiconductor device of the second aspect, even when the field-shield isolation structure is formed on the SOI substrate, the reliability of the field-shield isolation structure is increased and the parasitic capacitance between the gate electrode of the MOS transistor and the interconnection layer provided above the MOS transistor is reduced.

In the semiconductor device of the third aspect, since the impurity concentration in the SOI layer beneath the field-shield gate electrode is higher than that in the channel region of the MOS transistor formed in the SOI layer, the electrical resistance in the SOI layer beneath the field-shield gate electrode is lowered and through this portion of the SOI layer, the substrate potential can be fixed with reliability In the semiconductor device of the fourth aspect, since the channel region of the MOS transistor has the impurity of the first conductivity type having the first concentration and the impurity of the second conductivity type having the second concentration which is lower than the first concentration, the concentration of the impurity of the first conductivity type in the channel region is substantially lowered. The concentration of the impurity of the first conductivity type in the SOI layer beneath the field-shield gate electrode remains high. Thus, as the impurity concentration in the channel region keeps proper level while the impurity concentration in the SOI layer beneath the field-shield gate electrode is raised, the electrical resistance in the SOI layer beneath the field-shield gate electrode is lowered and through this portion of the SOI layer, the substrate potential can be fixed with reliability.

In the semiconductor device of the fifth aspect, providing the first and second insulating films with resistance to oxidation on and under the field-shield gate electrode prevents oxidation of the field-shield gate electrode resulting in a decrease in thickness.

In the semiconductor device of the sixth aspect, precise alignment of the field-shield isolation structure can be achieved by using the superimposition check masks in the manufacturing process.

In the semiconductor device of the seventh aspect, deviation of the field-shield isolation structure in the first direction and the second direction perpendicular to the first direction can be checked by the position of the field-shield isolation structure formed on each of the first and second groups of LOCOS oxide layers.

In accordance with the method for the manufacturing the semiconductor device of the eighth aspect, forming the sacrifice oxide film on the semiconductor substrate allows correction of the dent of the semiconductor substrate created near the edge portion of the side wall oxide film when the side wall oxide film is formed, to prevent any defect in the Pate oxide film of the MOS transistor due to the dent of the semiconductor substrate, and therefore the reliability of the gate oxide film is increased. Further, since the edge portion of the field-shield oxide film becomes thicker by the sacrifice oxide film and the surface of the semiconductor substrate on which the MOS transistor is formed is consumed by oxidation, the surface of the semiconductor substrate on which the MOS transistor is formed is retracted to be lower than the surface of the semiconductor substrate on which the field-shield oxide film is formed. Taking full advantage of an action that the sacrifice oxide film absorbs the impurity in the semiconductor layer, it is possible to voluntarily change the impurity concentration of the semiconductor substrate depending on the location.

In accordance with the ninth aspect, it is possible to provide the method suitable for manufacturing the semiconductor device with the field-shield isolation structure on the SOI substrate.

In accordance with the tenth and eleventh aspects, it is possible to provide the method suitable for manufacturing the semiconductor device having the construction in which the impurity concentration in the SOI layer beneath the field-shield gate electrode is higher than that in the channel region of the MOS transistor formed in the SOI layer.

In accordance with the method for the manufacturing the semiconductor device of the twelfth aspect, since the impurity of the second conductivity type is injected into the SOI layer through the filed-shield oxide film, entrance of unnecessary substances into the SOI layer is blocked and therefore contamination of the SOI layer is prevented.

In accordance with the thirteenth aspect, specific construction and method for alignment in forming the field-shield isolation structure can be provided. Further, since the superimposition check mark is formed before forming the field-shield isolation structure, the channel injection may be selectively performed before forming the field-shield isolation structure by using the superimposition check mark for alignment of the masks in the channel injection, for example. Therefore, it is possible to make the impurity concentration in the channel injection region uniform and prevent the impurity from injecting out of the desired region since no change of the injection energy is needed.

In accordance with the fourteenth aspect, specific method for forming the first and second insulating films with resistance to oxidation on and under the field-shield gate electrode can be provided.

By the method for the manufacturing the semiconductor device of the fifteenth aspect, precise thickness of the field-shield oxide film can be obtained.

An object of the present invention is to provide a construction of MOS transistor with field-shield isolation structure and a method for manufacturing the same, by which the reliability of a gate oxide film is improved and problems caused by channel injection are resolved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 27 to 42 illustrate steps in a process for manufacturing the semiconductor device in accordance with the fourth preferred embodiment of the present invention;

FIG. 43 illustrates how to use superimposition check marks;

DESCRIPTION OF THE PREFERRED EMBODIMENTS

The First Preferred Embodiment

<1-1. Device Construction>

With reference to FIGS. 1 to 9, a semiconductor device and a manufacturing method therefor in accordance with the first present embodiment of the present invention will be discussed.

Figure 1:
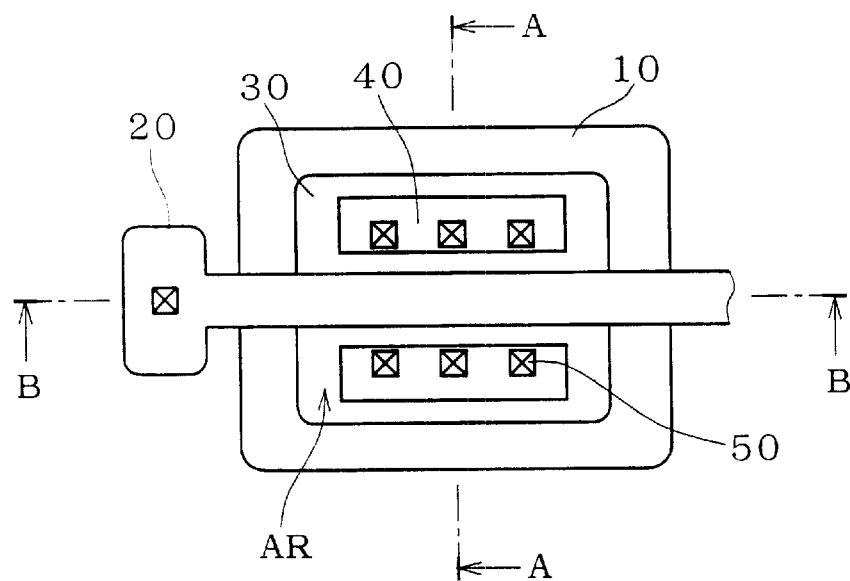
FIG. 1 is a plan view of a semiconductor device with field-shield isolation structure.

FIG. 1 is a plan view of a semiconductor device with field-shield isolation structure. In this figure, defining the active region AR of the MOS transistor, a field-shield (FS) gate electrode 10 is formed like a rectangular ring to make a field-shield isolation structure and a gate electrode 20 of the MOS transistor is formed above the FS gate electrode 10 so as to halve the FS gate electrode 10.

The active regions AR externally located on both sides of the gate electrode 20 are regions to serve as source/drain (S/D) regions 30 and above the S/D regions 30, S/D electrodes 40 mainly made of aluminum are formed. A plurality of contact holes 50 are formed between the S/D regions 30 and the S/D electrodes 40.

Further, insulating layers are provided between the FS gate electrode 10 and the gate electrode 20 and between the S/D region 30 and the S/D electrode 40, but not shown in this figure, for convenience of illustration, to allow main elements to be clearly seen.

Figure 2:
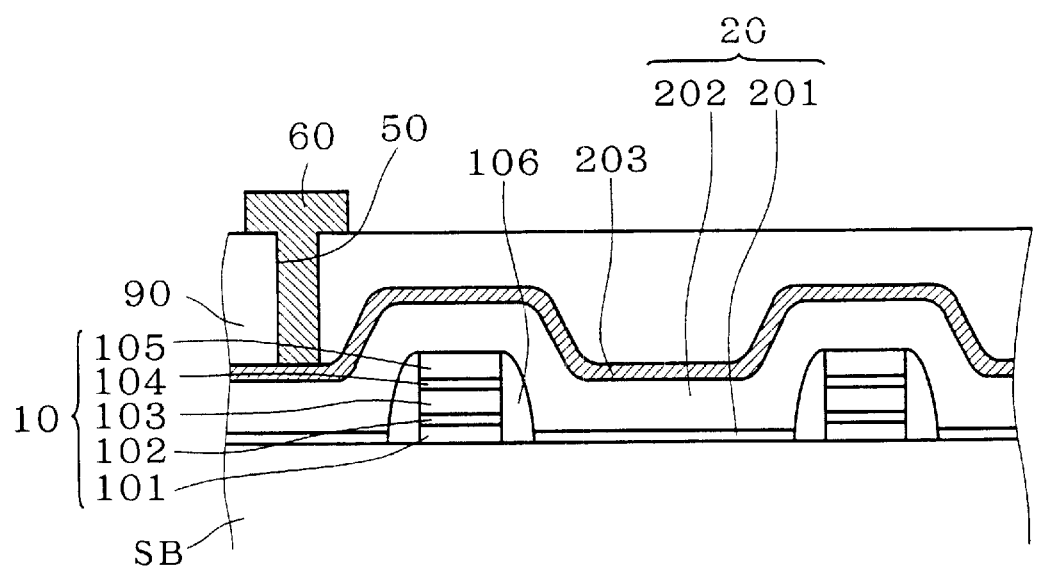
FIG. 2 is a cross section showing a construction of a semiconductor device in accordance with a first preferred embodiment of the present invention.

FIG. 2 is a cross section taken along the lines B—B of FIG. 1, showing a construction of the MOS transistor and the FS gate electrode formed on the bulk silicon substrate.

In FIG. 2, a gate oxide film 201 is formed on the surface of the silicon substrate SB between two FS gate electrodes 10, and a polysilicon layer 202 is formed so as to cover the gate oxide film 201 and the FS gate electrode 10. A salicide film 203 is formed on the polysilicon layer 202. Furthermore, in the silicon substrate SB beneath the gate oxide film 201, a channel region is created when the device operates.

The FS gate electrode 10 has an FS gate oxide film (field-shield oxide film) 101 formed on the surface of the silicon substrate SB, an FS lower nitride film (a first insulating film with resistance to oxidation) 102, a polysilicon layer 103, an FS upper nitride film (a second insulating film with resistance to oxidation) 104 and an FS upper oxide film 105 which are formed on the FS gate oxide film 101 in this order, and side wall oxide films 106 are formed on the side surfaces of these films and layer. Furthermore, in some cases, the construction of the FS gate electrode 10 is referred to as a field-shield isolation structure and the polysilicon layer 103 is referred to as an FS gate electrode. Moreover, a characteristic feature in construction of the present invention is found near edge portions of the FS gate electrode 10 and this will be discussed later in detail with reference to FIGS. 3 to 9.

An interlayer insulating film 90 is formed so as to cover the FS gate electrode 10, the gate electrode 20 and the S/D region 30 (not shown). A contact hole 50 is formed, penetrating the interlayer insulating film 90 located on an end portion of the gate electrode 20 and filled with a conductor, to thereby electrically connect the gate electrode 20 and a gate interconnection layer 60 to each other.

<1-2. Manufacturing Method>

Hereinafter, with reference to FIGS. 3 to 9, a method for manufacturing the semiconductor device with field-shield isolation structure will be discussed. Discussion will be presented below mainly on a process for manufacturing the FS gate electrode 10.

First, the FS gate oxide film 101, the FS lower nitride film 102, the polysilicon layer 103, the FS upper nitride film 104 and the FS upper oxide film 105 are layered on the silicon substrate SB (implanted with channel) in this order.

The FS gate oxide film 101 is formed by CVD or thermal oxidation to have a thickness of 100 to 1000 Å. The FS lower nitride film 102 is formed by CVD, for example, to have a thickness of 100 to 500 Å. The polysilicon layer 103 is formed by CVD, for example, at the temperature of 600 to 800° C. to have a thickness of 500 to 1000 Å. The polysilicon layer 103 is implanted with phosphorus (P) of about $1 \times 10^{20}/cm^3$ as impurity. The FS upper nitride film 104 is formed by CVD, for example, to have a thickness of 100 to 500 Å. The FS upper oxide film 105 is formed by CVD, for example, at the temperature of 700° C. to have a thickness of 500 to 1000 Å.

Figure 3:
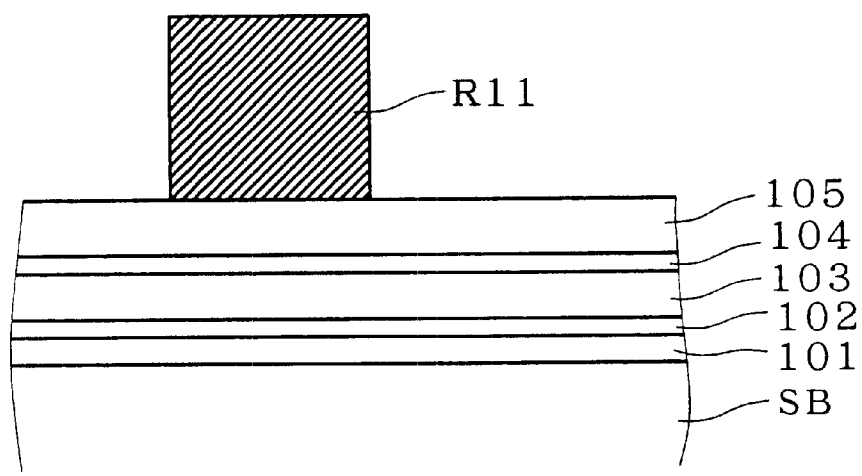
FIGS. 3 to 9 illustrate steps in a process for manufacturing the semiconductor device in accordance with the first preferred embodiment of the present invention.

In the step of FIG. 3, a resist mask R11 is selectively formed on the FS upper oxide film 105 and then multiple layers of the FS upper oxide film 105 to the FS lower nitride film 102 are selectively removed. The FS gate oxide film 101 is left in order to reduce the damage on the silicon substrate SB due to the etching.

Subsequently, after removing the resist mask R11, an oxide film 107 which is to become the side wall oxide film 106 is formed by CVD in the step of FIG. 4.

Figure 5:
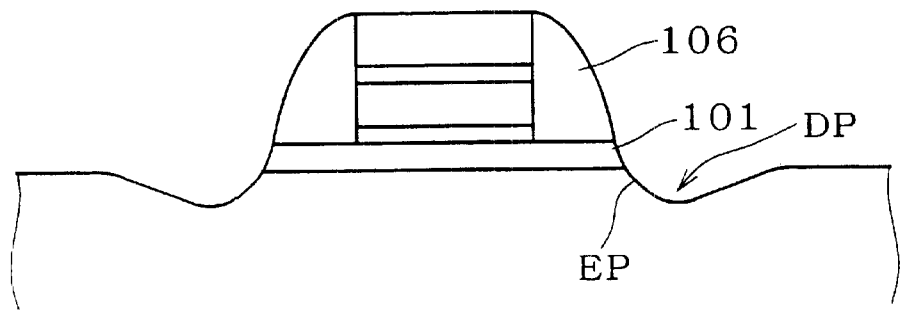

In the step of FIG. 5, the oxide film 107 is removed by anisotropic dry etching, to form the side wall oxide film 106 on the side surfaces of the multiple layers, consisting of the FS lower nitride film 102, the polysilicon layer 103, the FS upper nitride film 104 and the FS upper oxide film 105. In this step, the FS gate oxide film 101 outside the side wall oxide film 106 is also removed, and at this time the silicon substrate SB near the edge portion of the side wall oxide film 106 is scooped out to create a dent portion DP.

In the step of FIG. (, a sacrifice oxide film SO is formed on the surface of the silicon substrate SB. The sacrifice oxide film SO is formed by CVD or thermal oxidation at the temperature of 750 to 1200° C. to have a thickness of 100 to 500 Å.

The sacrifice oxide film SO is formed not only on the exposed surface of the silicon substrate SB but also on the surface of the silicon substrate SB covered with the FS gate electrode 10, and as a result the FS gate oxide film 101 becomes thicker.

Figure 6:
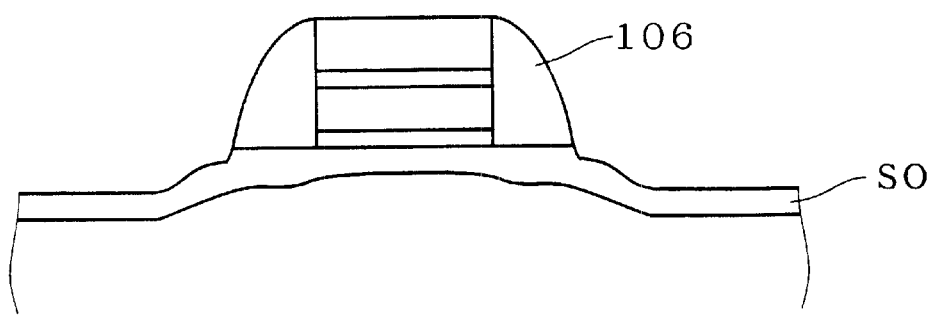

Specifically, as shown in FIG. 6, the FS gate oxide film 101 beneath the side wall oxide film 106, at the edge portion of the FS gate electrode 10, is thicker. That is because oxygen used as an oxidizing agent for forming the sacrifice oxide film SO intrudes into the silicon substrate SB beneath the side wall oxide film 106, to oxidize the silicon substrate SB.

Increasing the thickness of the FS gate oxide film 101 at the edge portion of the FS gate electrode 10 ensures higher reliability of the FS gate.

Formation of the FS gate oxide film 101 by CVD has a disadvantage because, in general, an oxide film formed by CVD (a CVD oxide film) is inferior in reliability (resistance to dielectric breakdown and the like) to that formed by thermal oxidation (a thermal oxide film). In this preferred embodiment, however, the FS gate oxide film 101 at the edge portion of the FS gate electrode 10 becomes thicker when the sacrifice oxide film SO is formed, to prevent dielectric breakdown also at the edge portion where electric field concentration is liable to occur, and therefore the CVD oxide film can achieve reliability equivalent to that of the thermal oxide film. Furthermore, the thickness of the FS gate oxide film 101 at the edge portion of the FS gate electrode 10 can be controlled to some extent by the thickness of the sacrifice oxide film SO, and on the other hand, if the FS gate oxide film involuntarily becomes thicker with formation of the gate oxide film, the thickness of the FS gate oxide film, not being voluntarily selected, can not be controlled.

The oxygen intrudes further inwardly through the side wall oxide film 106, but the polysilicon layer 103 is not oxidized as its upper and lower surfaces are covered with the FS upper nitride film 104 and the FS lower nitride film 102, thus preventing a decrease in thickness of the polysilicon layer 103. If the decrease in thickness of the polysilicon layer 103 does not particularly matter, for example, in case where the polysilicon layer 103 is sufficiently thick, it is not necessary to provide the FS upper nitride film 104 and the FS lower nitride film 102.

Moreover, as shown in FIG. 6, the level difference of the dent portion DP near the edge portion of the side wall oxide film 106 is reduced by the sacrifice oxide film SO. Paving attention to the edge portion EP in the dent portion DP, the oxygen intrudes into the edge portion EP from the side wall of the FS gate oxide film 101 and the side wall of the dent portion DP and therefore the edge portion EP has the highest silicon consumption. As a result, the edge portion EP is rounded and the dent portion DP becomes even, with its level difference reduced.

Furthermore, since the silicon in the surface of the silicon substrate SB is, consumed by forming the sacrifice oxide film SO, the surface of the silicon substrate SB is retracted by this silicon consumption after removing the sacrifice oxide film SO. Thus, the distance between the gate electrode formed in this portion and the interconnection layer formed with the interlayer insulating film interposed increases by the retraction of the silicon substrate SB. Thus, the parasitic capacitance therebetween is reduced, and a semiconductor device with faster operation and less power consumption can be provided.

Before and after forming the sacrifice oxide film SO, annealing is performed on the FS gate oxide film 101 and the FS upper oxide film 105 at the temperature of 1000 to 1200° C. for 10 to 60 minutes.

This annealing has a purpose to remove the damage due to etching, and if the FS gate oxide film 101 and the FS upper oxide film 105 are formed by CVD, it has another purpose to enhance the etching rate of the CVD oxide film, i.e., the FS gate oxide film 101 ad the FS upper oxide film 105, to the level as high as that of a thermal oxide film in the later wet etching (usually the etching rate of the CVD oxide film is lower than that of the thermal oxide film).

Subsequently, in the step of FIG. 7, the sacrifice oxide film SO is removed by wet etching. In this case, no dent portion is found at the edge portion of the FS gate electrode 10, in the silicon substrate SB.

Figure 8:
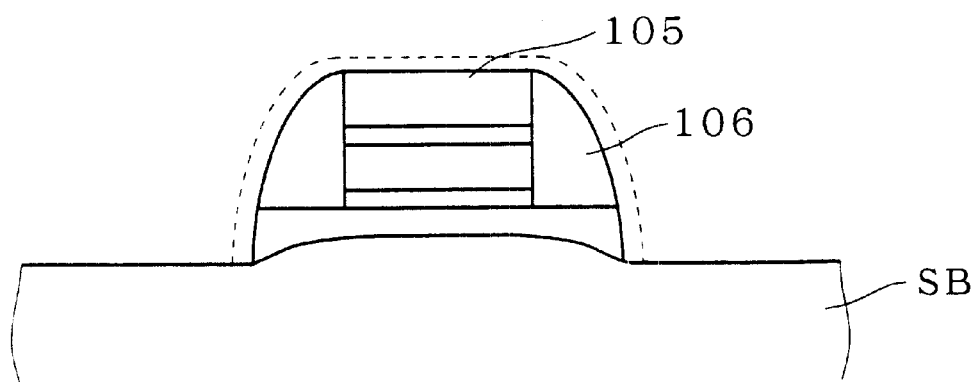

In the step of FIG. 8, prior to forming the gate oxide film, wet etching is entirely performed to remove a natural oxide film formed on the surface of the silicon substrate SB. At this time, together with the natural oxide film, the FS upper oxide film 105 and the side wall oxide film 106 are slightly removed, and retracted. In FIG. 8, the broken line indicates where the FS upper oxide film 105 and the side wall oxide film 106 were formed before removing the natural oxide film. As is clear form FIG. 8, even when the FS upper oxide film 105 and the side wall oxide film 106 are retracted, no edge portion is formed in the periphery of the side wall oxide film 106.

Figure 9:
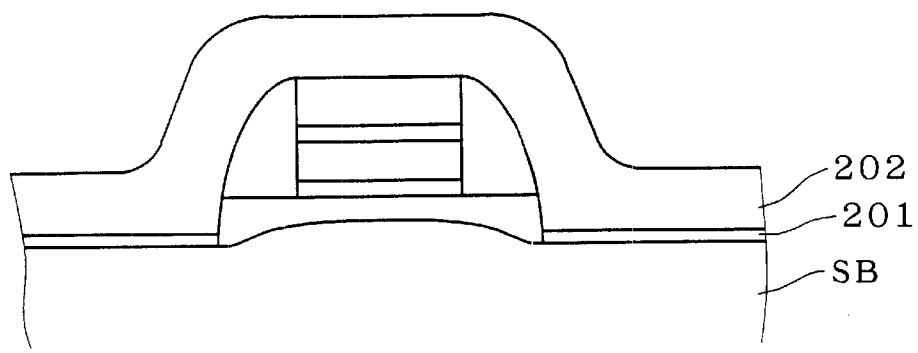

Consequently, as shown in FIG. 9, there is no defect in the periphery of the side wall oxide film 106 due to the existence of the edge portion when the gate oxide film 201 is formed, and therefore the reliability of the gate oxide film is increased in the semiconductor device with field-shield isolation structure.

In the step of FIG. 9, the polysilicon layer 202 which is a body of the gate electrode is formed on the gate oxide film 201, and then a salicide film (not shown) is formed, being self-aligned, only on the upper surface of the gate electrode 20 and the surface of the S/D region (not shown) and the interlayer insulating film 90 is formed so as to cover the FS gate electrode 10, the gate electrode 20 and the S/D region 30. Thus, the semiconductor device with field-shield isolation structure of the first preferred embodiment shown in FIGS. 1 and 2 can be provided.

In Japanese Patent Application Laid Open Gazette 7-237185 showing a construction in which end portions of a shield gate oxide film are bloated as a background art, no description is found on any construction in which a surface of a semiconductor substrate on which a MOS transistor is formed is located lower than a surface of the semiconductor substrate on which a field-shield oxide film is formed and its action and effect, unlike the present invention. In Japanese Patent Application Laid Open Gazettes 2-137335 and 6-204237 making a reference to the thickness of end portions of a gate oxide film, no reference is made to the thickness of edge portions of a field-shield oxide film, and no description is found on any construction in which a surface of a semiconductor substrate on which a MOS transistor is formed is located lower than a surface of the semiconductor substrate on which the field-shield oxide film is formed and its action and effect, unlike the present invention.

<1-3. Modification>

Figure 4:
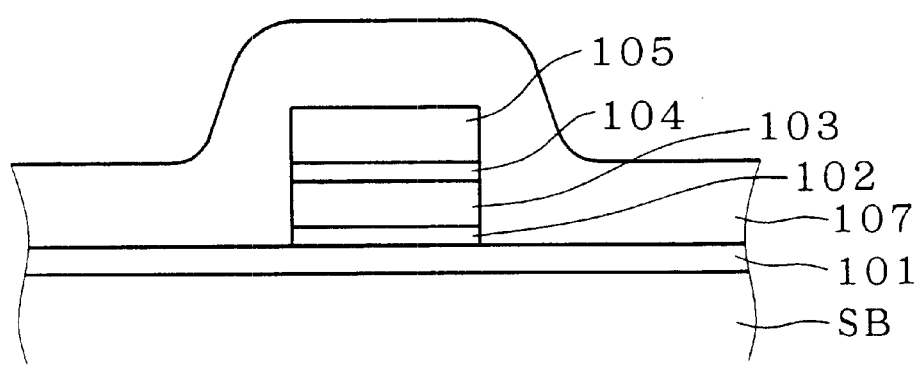

In the above discussion on the first preferred embodiment of the present invention with reference to FIGS. 3 and 4, an example is taken, where the resist mask R11 is selectively formed on the FS upper oxide film 105 and using with the resist mask R11, the multiple layers of the FS upper oxide film 105 to the FS lower nitride film 102 are selectively removed. As another example, there may be a method where only the FS upper oxide film 105 is patterned with the resist mask R11 and other films are patterned with the FS upper oxide film 105 used as a mask.

That suppresses occurrence of the inconvenience due to the use of the resist mask R11. Specifically, discussing, if the resist mask R11 is used, the impurity released from the resist mask R11 is deposited on the side wall of the film thereberneath and the width of the film increases. If this phenomenon occurs in more than one layer, there arises a possibility that the cross section of the multilayered structure may become so stepped that the shape of the resist mask R11 can not be precisely reflected. Limiting the use of the resist mask R11 suppresses occurrence of such inconvenience as above.

Further, in the above discussion on the first preferred embodiment of the present invention with reference to FIGS. 3 and 4, an example is taken, where the oxide film 107 which is to become the side wall oxide film 106 is formed by CVD without removing the FS gate oxide film 101. As another example, there may be a method where the oxide film 107 which is to become the side wall oxide film 106 is formed after removing the FS gate oxide film 101. In this case, though a dent portion is created in the silicon substrate SB at the edge portion of the FS gate electrode 10, the dent portion can be surely resolved by the sacrifice oxide film SO.

The Second Preferred Embodiment

Though the semiconductor device with field-shield isolation structure formed on the bulk silicon substrate is discussed in the first preferred embodiment with reference to FIGS. 1 to 9, it is sure that the present invention can apply to the semiconductor device with field-shield isolation structure formed on the SOI (Silicon On Insulator) substrate, and specifically, the reliability of the gate oxide film and the FS gate oxide film is increased by forming the sacrifice oxide film on the surface of the silicon substrate also in the semiconductor device with field-shield isolation structure formed on the SOI substrate. Moreover, the above method produces further action and effect.

Since the SOI device has a structure in which the channel is in a floating state, there arises a problem of, for example, degradation of drain breakdown voltage due to floating-substrate effect (an phenomenon caused by a channel in a floating state). To solve this problem, it is effective to fix the substrate potential, i.e., the channel potential by providing a substrate electrode (body electrode). The semiconductor device with field-shield isolation structure is most suitable for providing the body electrode.

<2-1. Device Construction>

Figure 10:
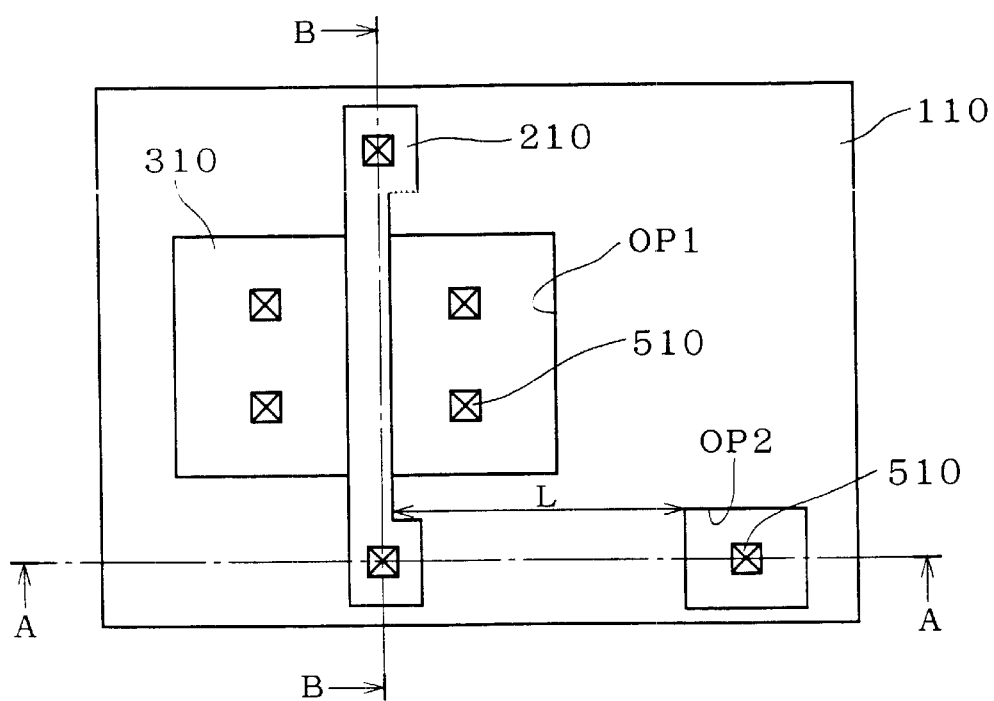
FIG. 10 is a plan view of an SOI device with field-shield isolation structure.

FIG. 10 is a plan view of an exemplary SOI device with field-shield isolation structure. In this figure, an opening portion OP1 is provided in an FS gate electrode 110 which is a rectangular from plan view, serving as the active region AR of the MOS transistor. A gate electrode 210 of the MOS transistor is formed so as to halve the active region AR. The active regions AR externally located on both sides of the gate electrode 210 are regions to serve as source/drain (S/D) regions 310. Further, contact holes 510 are connected to the S/D region 310.

The edge portions along the length of the gate electrode 210 are extended onto the FS gate electrode 110, to which the contact holes 510 are connected.

In addition to the opening portion OP1, an opening portion OP2 is provided, to which the contact hole 510 is connected for connection with the body electrode.

Figure 11:
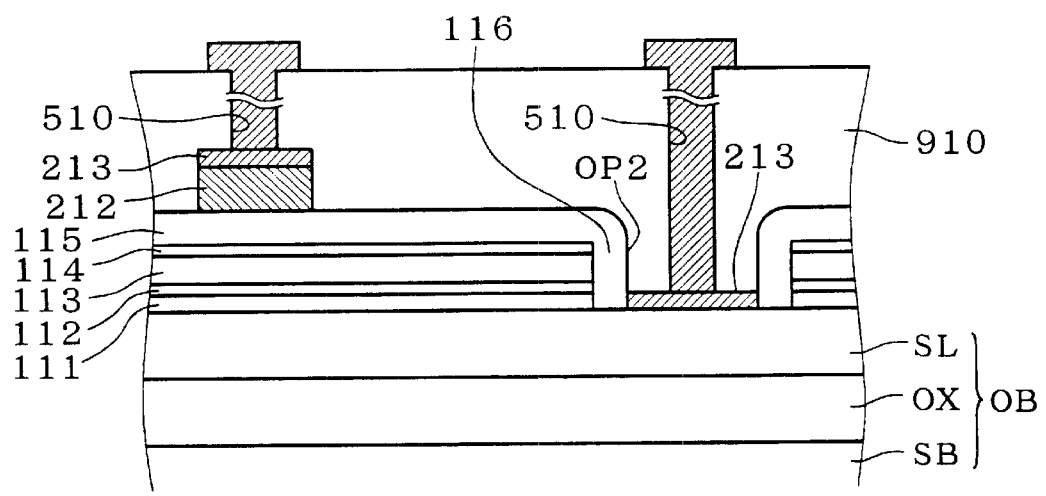
FIGS. 11 and 12 are cross sections each showing a construction of a semiconductor device in accordance with a second preferred embodiment of the present invention.
Figure 12:
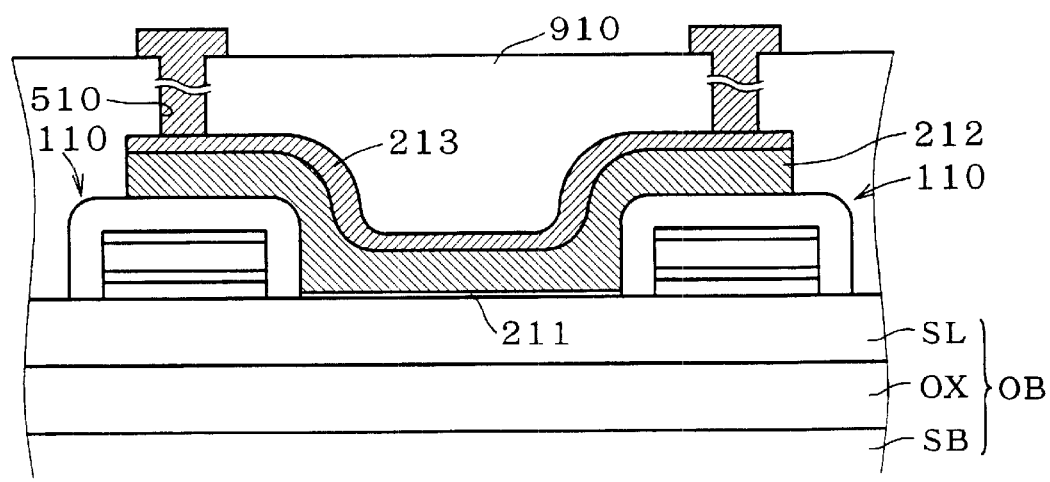

FIGS. 11 and 12 are cross sections taken along the lines A—A and B—B, respectively, of FIG. 10.

In FIG. 11, the FS gate electrode 110 is formed on an SOI substrate OB. The SOI substrate OB consists of an insulating substrate including the silicon substrate SB and a buried oxide layer OX formed thereon, and a SOI layer (single crystalline silicon layer) SL formed on the insulating substrate. The FS gate electrode 10 has an FS gate oxide film 111 formed on the surface of the SOI layer SL, an FS lower nitride film 112 formed on the FS gate oxide film 11, a polysilicon layer 113, an FS upper nitride film 114 and an FS upper oxide film 115, and side wall films 116 are formed on the side surfaces of these films and layer.

The SOI substrate OB may be formed by SIMOX (Separation by Implanted Oxygen), wafer bonding and any other methods.

A polysilicon layer 212 is partially formed on the FS gate electrode 110 and a salicide film 213 is formed on the polysilicon layer 212.

Another salicide film 213 which is to serve as a body electrode is formed on the surface of the SOI layer SL at the bottom of the opening portion OP2 provided in the FS gate electrode 110, and an interlayer insulating film 910 is formed so as to cover the FS gate electrode 110 and the opening portion OP2. The contact holes 510 are formed, penetrating the interlayer insulating film 910, on the salicide film 213 formed in the opening portion OP2 and on the salicide film 213 formed on the polysilicon layer 212.

In FIG. 12, the gate oxide film 211 is formed on the surface of the SOI layer SL between two FS gate electrodes 110, and the polysilicon layer 212 is formed so as to cover the gate oxide film 211 and partially cover the FS gate electrodes 110. The salicide film 213 is formed on the polysilicon layer 212.

The interlayer insulating film 910 is formed over the FS gate electrodes 110 and the gate electrode 210 and the contact holes 510 are formed, penetrating the interlayer insulating film 910, at the edge portions of the polysilicon layer 212.

In the semiconductor device having the construction of FIG. 10, how reliably the body potential is fixed depends on the resistance across the channel of the transistor and the body electrode, i.e., on the resistance of the SOI layer beneath the FS gate electrode.

Furthermore, the resistance value of the SOI layer beneath the FS gate electrode depends on the film thickness of the SOI layer, the impurity concentration thereof and the distance between the channel of the transistor and the body electrode. Specifically, in FIG. 11, it depends on the film thickness of the SOI layer SL, the impurity concentration thereof and the distance between the salicide film 213 and the SOI layer SL below the polysilicon layer 212. In FIG. 10, the minimum distance L between the edge portion of the opening portion OP2 and the body of the gate electrode 210 is the distance between the channel of the transistor and the body electrode.

In order to reduce the resistance value of the SOI layer beneath the FS gate electrode, it is necessary to shorten the minimum distance L as much as possible. If that is difficult in terms of the device construction, it is instead necessary to increase the film thickness in the SOI layer SL or increase the impurity concentration in the SOI layer SL.

For optimization of transistor characteristics, a limit is imposed on the film thickness of the SOI layer SL. For example, the SOI layer SL must have a film thickness of about 1000 Å.

It is impossible to set the impurity concentration in the SOI layer SL too high since it is determined in accordance with the impurity concentration in the channel region.

The method of the first preferred embodiment, however, in which the sacrifice oxide film is formed in the substrate of the silicon substrate, meets these requirements and further can reduce the resistance value of the SOI layer beneath the FS gate electrode.

Referring to a manufacturing process, a construction for reducing the resistance value of the SOI layer beneath the FS gate electrode will be discussed below.

<2-2. Manufacturing Method>

With reference to FIGS. 13 to 17, a method for manufacturing the semiconductor device with field-shield isolation structure will be discussed. Discussion will be presented below mainly on a process for manufacturing the FS gate electrode 110 of FIG. 12.

Figure 13:
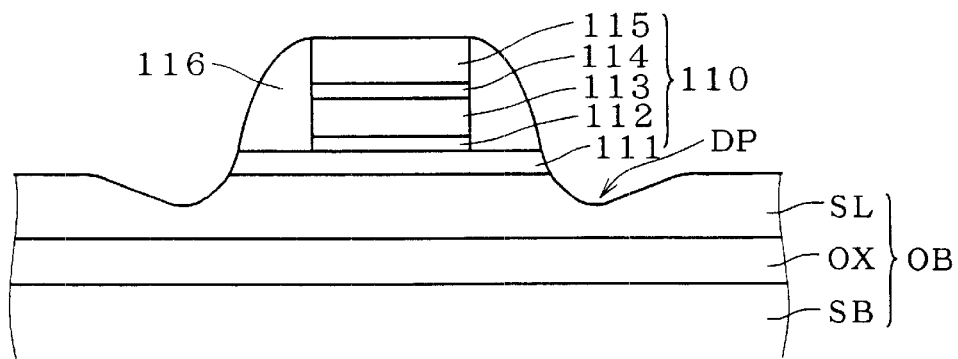
FIGS. 13 to 17 illustrate steps in a process for manufacturing the semiconductor device in accordance with the second preferred embodiment of the present invention.

The step of forming the FS gate oxide film 111, the FS lower nitride film 112, the polysilicon layer 113, the FS upper nitride film 114 and the FS upper oxide film 115 on the SOI substrate OB in this order and the step of forming the side wall oxide film 116 on the side walls of these films and layer, ie, the steps prior to FIG. 13, is much the same as those for manufacturing the semiconductor device in the first preferred embodiment discussed with reference to FIGS. 3 to 5, so the redundant discussion is omitted.

While the impurity is injected (channel injection) into the silicon substrate SB so that the impurity concentration may become suitable for the channel region prior to forming the FS gate electrode 110 in the first preferred embodiment, the impurity is injected into the SOI layer SL so that the impurity concentration may become higher than that suitable for the channel region prior to forming the FS gate electrode 110 in the second preferred embodiment. For example, if an NMOS transistor is formed, boron (B) is injected as impurity at an energy of 10 to 30 KeV at a dose of $1 \times 10^{12}$ to $5 \times 10^{13}/cm^2$.

Furthermore, in the step of FIG. 13, the SOI layer SL near the side wall oxide film 116 is scooped out to create the dent portion DP, like in the formation of the FS gate electrode on the bulk silicon substrate.

Subsequently, in the step FIG. 14, the sacrifice oxide film SO is formed on the surface of the SOI layer SL. The method for forming the sacrifice oxide film SO is the same as that of the first preferred embodiment, so no discussion will be presented thereon.

Then, the reliability of the gate oxide film is increased to as high as that of the thermal oxide film since the FS gate oxide film 111 at the edge portion of the FS gate electrode 110 is made thicker by forming the sacrifice oxide film SO and further the reliability of the gate oxide film is increased since the level difference of the dent portion DP near the edge portion of the side wall oxide film 116 is reduced to make no edge portion, like in the first preferred embodiment.

Figure 14:
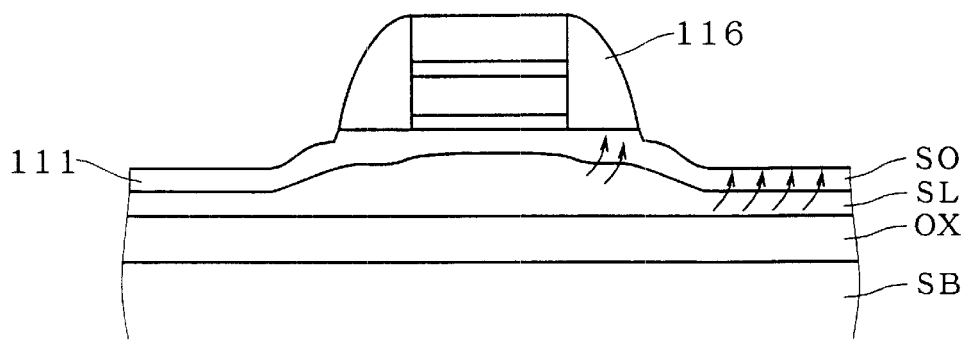

Taking full advantage of an action that the sacrifice oxide film SO absorbs the impurity in the SOI layer SL, the impurity concentration in the channel region (inside the SOI latter SL not beneath the FS gate electrode 110 in FIG. 14) can be set suitable for the channel region while the impurity concentration in the SOI layer SL beneath the FS gate electrode 110 is high, keeping the concentration which is determined before forming the FS gate electrode (initial concentration).

Specifically, as indicated by arrows in FIG. 14, as the sacrifice oxide film SO absorbs the impurity in the SOI layer SL, the impurity concentration in the channel region becomes lower than that determined before forming the FS gate electrode. In consideration of the amount of impurity to be absorbed, the initial concentration of the impurity can be determined so that the impurity concentration may become proper after absorption of the impurity in the channel region.

Thus, while the requirement of proper impurity concentration in the channel region is satisfied by taking full advantage of the action that the sacrifice oxide film SO absorbs the impurity in the SOI layer SL, the impurity concentration in the SOI layer SL beneath the FS gate electrode 110 can be raised and the resistance value of the SOI layer beneath the FS gate electrode can be lowered.

Taking full advantage of an action that the silicon in the surface of the SOI layer SL is consumed by forming the sacrifice oxide film SO and the surface of the SOI layer SL is retracted by the silicon consumption after removing the sacrifice oxide film SO, the SOI layer SL beneath the FS gate electrode 110 is thicker and the SOI layer SL in the channel region has a thickness suitable for the channel region.

Figure 15:
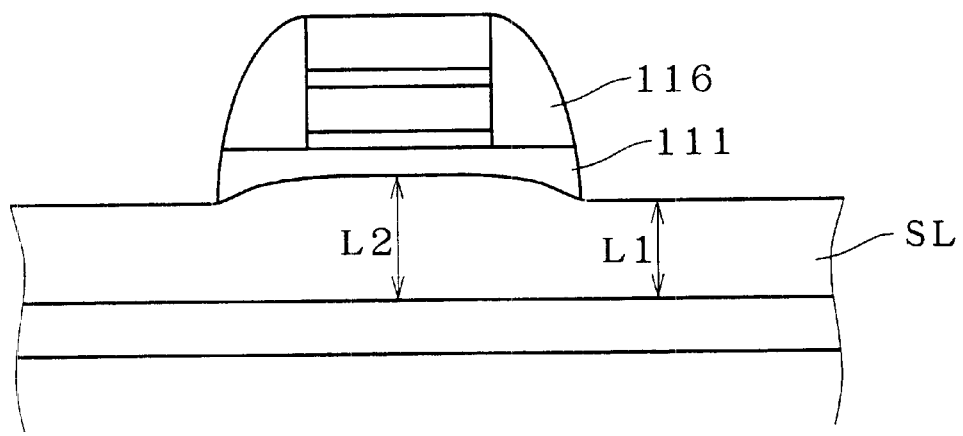

In the step of FIG. 15, the sacrifice oxide film SO is removed, and as a result the SOI layer SL in the channel region and that beneath the FS gate electrode 110 have different thickness. Specifically, the thickness of the SOI layer SL in the channel region is represented by L1 while that of the SOI layer SL beneath the FS gate electrode 110 is represented by L2.

In the step of forming the SOI layer SL, the thickness of the SOI layer SL is set to L2 thicker than L1 which is suitable for operation characteristics of a transistor so that the thickness of the SO layer SL should become L1 after removing the sacrifice oxide film SO.

By this setting, while the requirement of proper thickness of the SOI layer SL in the channel region is satisfied, the SOI layer SL beneath the FS gate electrode 110 can be made thicker and the resistance value of the SOI layer beneath the FS gate electrode can be lowered.

Figure 16:
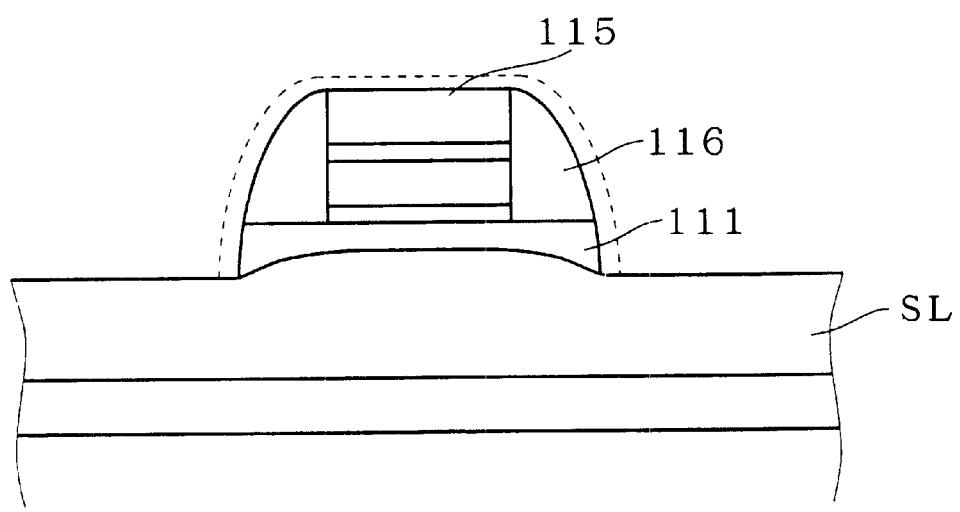
Figure 17:
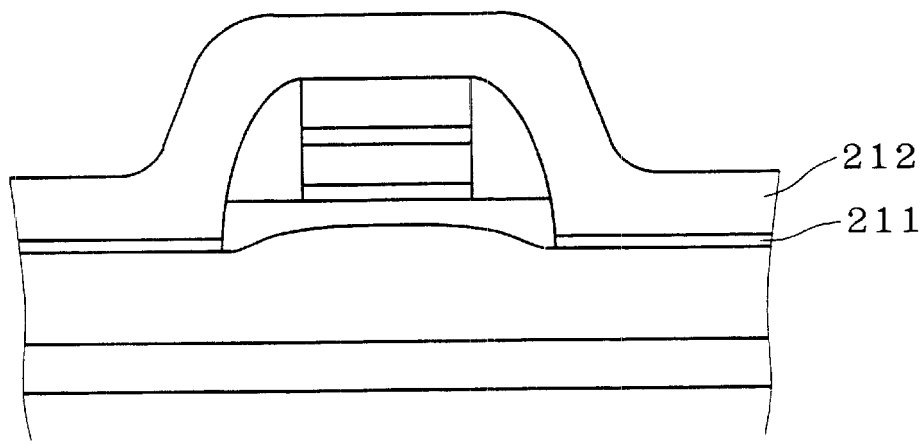

FIGS. 16 and 17 shows the step of performing wet etching entirely prior to forming the gate oxide film and the step of forming the gate oxide film 211 and the polysilicon layer 212, like those of FIGS. 8 and 9 respectively, in the first preferred embodiment and redundant discussion on these steps is omitted.

In Japanese Patent Application Laid Open Gazettes 56-104446 and 57-36842 disclosing a construction in which a semiconductor layer for isolation has higher impurity concentration, no reference is made to the problems inherent in an SOI substrate, and no description is found on any construction in which a surface of a semiconductor substrate on which a MOS transistor is formed is located lower than a surface of the semiconductor substrate on which a field-shield oxide film is formed and its action and effect of lowering the electric resistance of an SOI layer beneath a field-shield gate electrode.

The Third Preferred Embodiment

<3-1. Device Construction>

The second preferred embodiment of the present invention shows the construction intended to take full advantage of the action that the sacrifice oxide film SO absorbs the impurity in the SOI layer SL. If the impurity concentration in the SOI layer SL is so high that the impurity can not be fully absorbed by only the sacrifice oxide film SO, an injection may be performed with an ion opposite in conductivity type to that injected in the channel.

In other words, discussion will be presented below on a case where the impurity concentration in the SOI layer SL beneath the FS gate electrode 110 is as high as possible.

In this case, prior to forming the FS gate electrode 110, an impurity is injected into the SOI layer SL so that the impurity concentration therein may be too much higher than that suitable for the channel region. For example, if an NMOS transistor is formed, boron (B) is injected as impurity at an energy of 10 to 30 KeV at a dose of $1 \times 10^{12}$ to $1 \times 10^{14}/cm^2$.

If the injected ion has a dose of $1 \times 10^{14}/cm^2$, as its concentration is too high, it can not be fully absorbed to the concentration suitable for the channel region by only the sacrifice oxide film SO and therefore it is impossible to obtain a proper threshold value of transistor.

In this case, an injection with an ion opposite in conductivity type to boron in the SOI layer SL counteracts the action of the boron, to substantially lower the impurity concentration in the channel region.

Referring to a manufacturing process, a construction intended to reduce the resistance value of the SOI layer beneath the FS gate electrode will be discussed below.

<3-2. Manufacturing Method>

With reference to FIGS. 18 to 22, a method for manufacturing the semiconductor device with field-shield isolation structure will be discussed. Discussion will be presented below mainly on a process of manufacturing the FS gate electrode 110 of FIG. 12.

Figure 18:
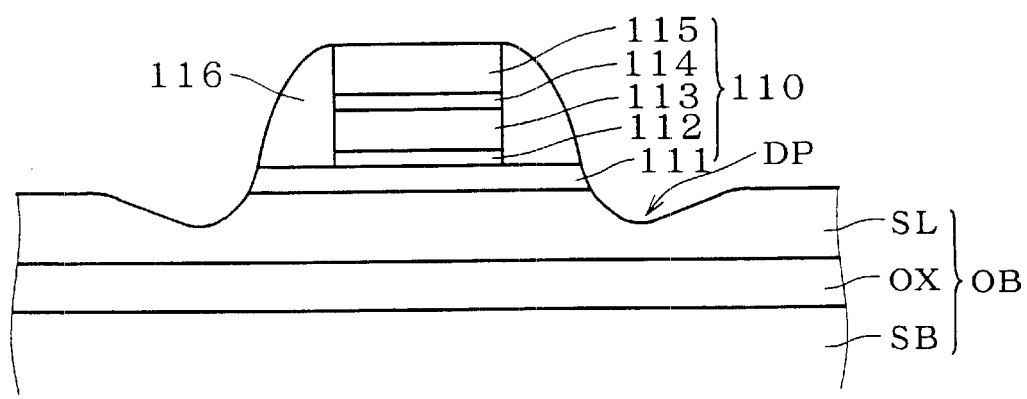
FIGS. 18 to 22 illustrate steps in a process for manufacturing the semiconductor device in accordance with a third preferred embodiment of the present invention.

As the steps prior to FIG. 18 is much the same as those for manufacturing the semiconductor device in the first preferred embodiment discussed with reference to FIGS. 3 to 5, so the redundant discussion is omitted.

While the impurity is injected (channel injection) into the silicon substrate SB so that the impurity concentration may become suitable for the channel region prior to forming the FS gate electrode 110 in the first preferred embodiment, the impurity is injected into the SOI layer SL so that the impurity concentration may become too much higher than that suitable for the channel region prior to forming the FS gate electrode 110 in the third preferred embodiment. For example, if an NMOS transistor is formed, boron (B) is injected as impurity at an energy of 10 to 30 KeV at a dose of $1 \times 10^{14}/cm^2$.

Subsequently, in the step FIG. 19, the sacrifice oxide film SO is formed on the surface of the SOI layer SL. The method for forming the sacrifice oxide film SO is the same as that of the first preferred embodiment, so no discussion will be presented thereon.

Then, the reliability of the gate oxide film is increased to as high as that of the thermal oxide film since the FS gate oxide film 111 at the edge portion of the FS gate electrode 110 is made thicker by forming the sacrifice oxide film SO and further the reliability of the gate oxide film is increased since the level difference of the dent portion DP near the edge portion of the side wall oxide film 116 is reduced to make no edge portion, like in the first preferred embodiment.

Figure 19:
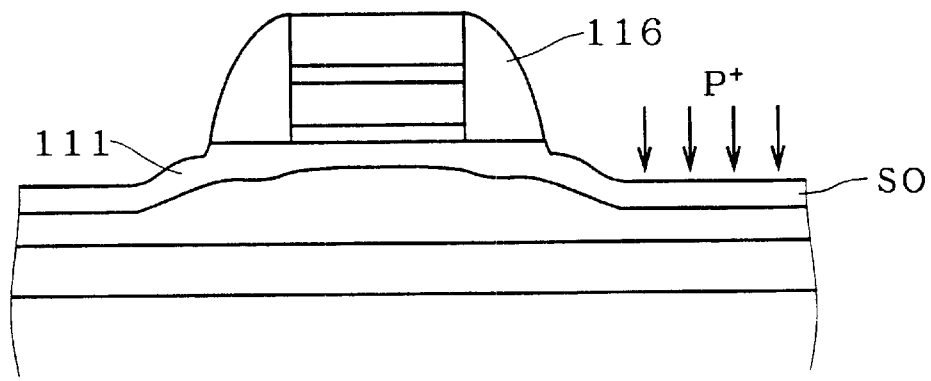

Furthermore, though the impurity of the channel region (inside the SOI layer SL not beneath the FS gate electrode 110 in FIG. 19) decreases by taking full advantage the action that the sacrifice oxide film SO absorbs the impurity of the SOI layer SL, as the impurity concentration is higher than that in the first preferred embodiment, the impurity concentration in the channel region can not be made proper only by the sacrifice oxide film SO.

Then, if the thickness of the SOI layer SL is 1000 Å and it is intended that the impurity concentration in the channel region should become $5 \times 10^{17}/cm^3$, phosphorus (P) is injected at a dose of $9.5 \times 10^{13}/cm^2$ after forming the sacrifice oxide film SO. In other words, the impurity concentration in the channel region is determined in accordance with the remaining dose of boron ion after subtracting the dose of phosphorus ion.

Furthermore, the amount of phosphorus to be injected can be determined in consideration of the amount of impurity to be absorbed by the sacrifice oxide film SO and the energy of ion injection.

As a result, the impurity concentration in the channel region is about $5 \times 10^{17}/cm^3$ and the impurity concentration in the SOI layer SL beneath the FS gate electrode 110 is about $1 \times 10^{19}/cm^3$. Thus, while the requirement of proper impurity concentration in the channel region is satisfied, the impurity concentration in the SOI layer SL beneath the FS gate electrode 110 can be raised and the resistance value of the SOI layer beneath the FS gate electrode can be lowered.

Figure 7:
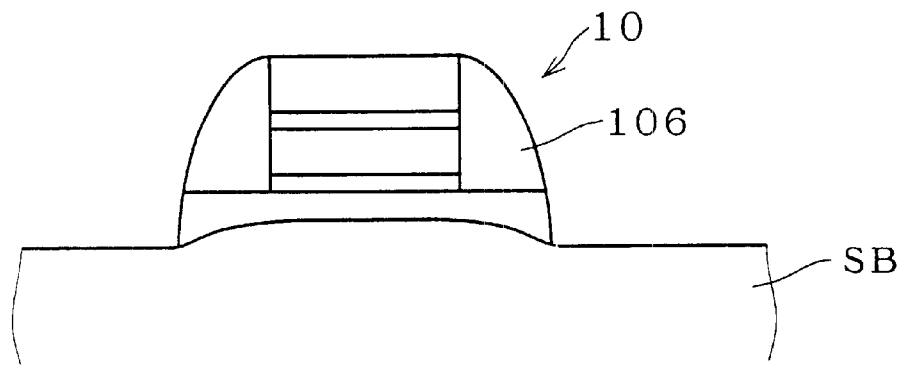
Figure 20:
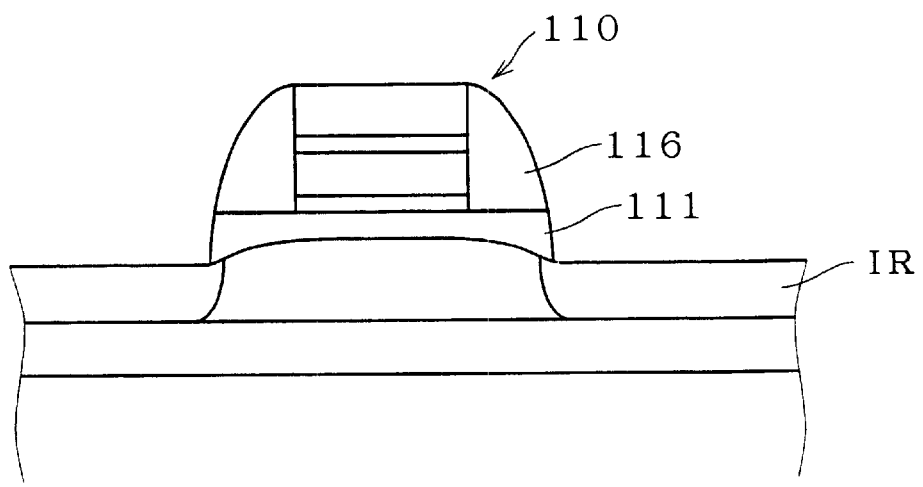
Figure 21:
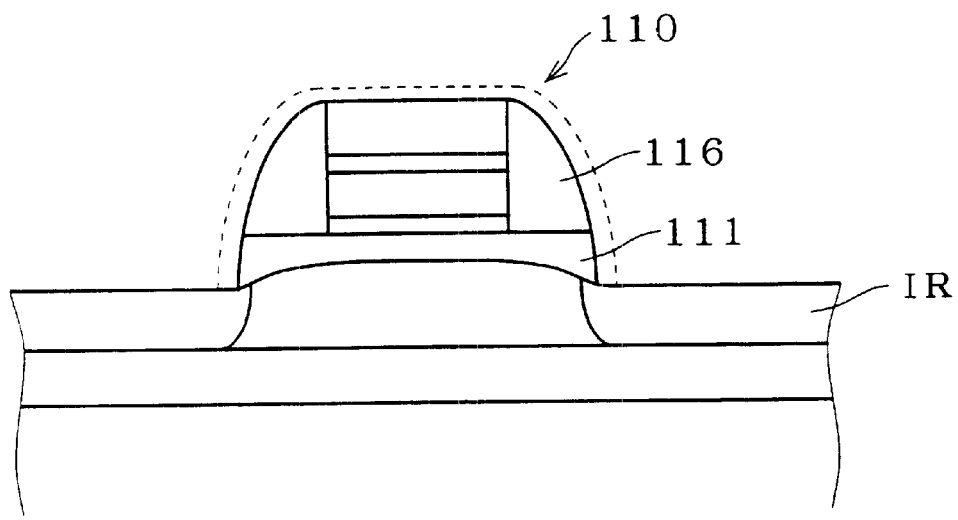
Figure 22:
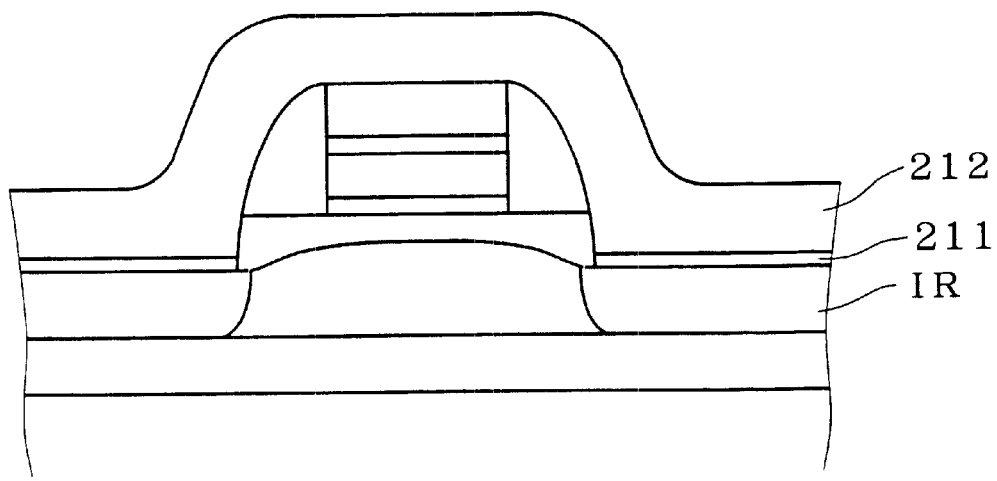

FIGS. 20 to 22 shows the steps of removing the sacrifice oxide film SO, performing wet etching entirely prior to forming the gate oxide film and forming the gate oxide film 211 and the polysilicon layer 212 like those of FIGS. 7 to 9 in the first preferred embodiment, respectively, and redundant discussion on these steps is omitted. Further, FIGS. 20 to 22 show a region IR to which the phosphorus ion is injected.

Furthermore, after the injection of phosphorous ions as show in FIG. 19, in order to recover from the damage in the SOI layer SL due to the ion injection, annealing may be performed at the temperature 600 to 800° C. for 10 to 60 minutes.

<3-3. Modification>

In the above discussion on the third preferred embodiment, an example is taken, where an ion opposite in conductivity type to that in the channel region of the SOI layer SL is injected after forming the sacrifice oxide film SO. As another example, there may be a method where the ion is injected before forming the side wall oxide film 116.

Figure 23:
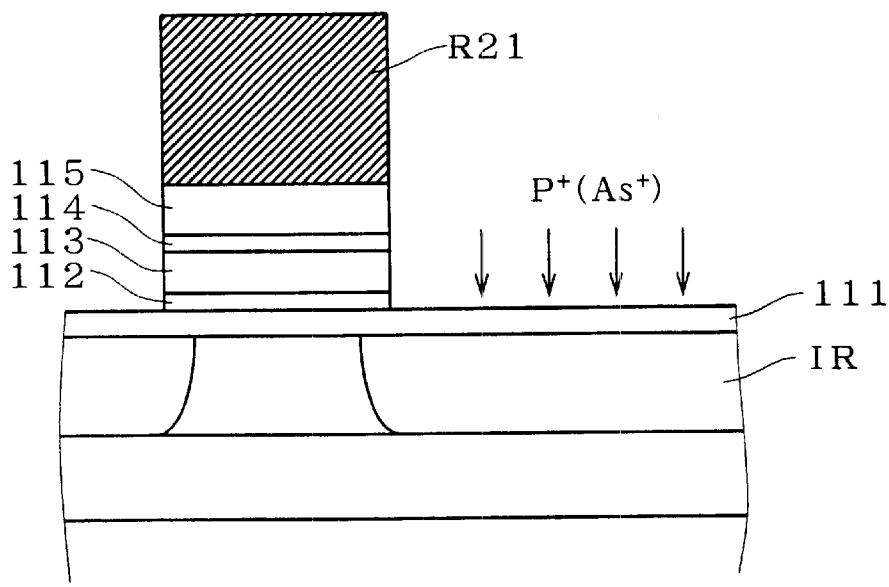
FIGS. 23 and 24 illustrate steps in a process for manufacturing the semiconductor device in accordance with a modification of the third preferred embodiment of the present invention.

Discussion will be presented below on a process of this method with reference to FIGS. 23 and 24. First, the FS gate oxide film 111, the FS lower nitride film 112, the polysilicon layer 113, the FS upper nitride film 114 and the FS upper oxide film 115 are formed on the SOI substrate OB (implanted with channel of high concentration) in this order. As shown in FIG. 23, a resist mask R21 is selectively formed on the FS upper oxide film 115 and the multiple layers of the FS upper oxide film 115 to the FS lower nitride film 112 are selectively removed.

Then, phosphorous or arsenic ions are injected from above the FS gate oxide film 111. This injection is performed under the same condition as that of the third preferred embodiment.

Figure 24:
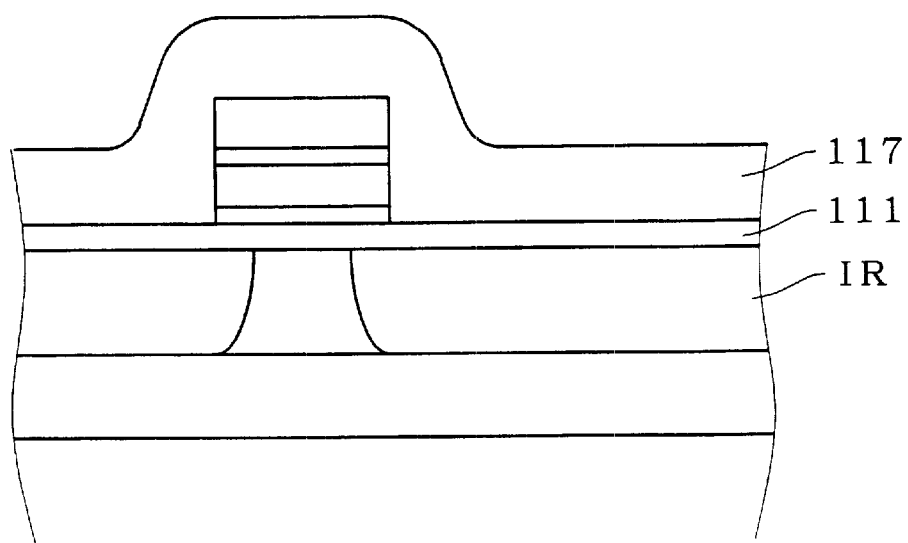

After removing the resist mask R21, the oxide film 117 which is to become the side wall oxide film 116 is formed by CVD in the step of FIG. 24. Subsequent steps, i.e., steps of forming the side wall oxide film 116, forming the sacrifice oxide film SO and forming the gate electrode 210, are the same as those of FIGS. 5 to 9 in the first preferred embodiment.

By performing the injection of the impurity opposite in conductivity type to that in the channel region before forming the side wall oxide film 116, the annealing before and/or after forming the sacrifice oxide film SO intended to improve the etching rate of the FS upper oxide film 115 also serves as that after injection of phosphorus ion intended to recover from the damage in the SOI layer SL due to the injection, and therefore the number of performances of annealing can be reduced.

Since the ions are injected from above the FS gate oxide film 111 which is relatively thick (100 to 1000 Å), the FS gate oxide film 111 blocks entrance of unnecessary substances which fly off from an ion injector into the SOI layer SL, to prevent contamination of the SOI layer SL.

The Fourth Preferred Embodiment

In the above discussion on the first to third preferred embodiments, examples are taken, where the present invention mainly applies to an NMOS transistor. The present invention, however, can surely apply to a PMOS transistor or a CMOS transistor.

Discussion will be presented on an example, as the fourth present invention, where that the present invention applies to a CMOS transistor. . In this preferred embodiment shown is a case where a CMOS transistor is formed on a SOI substrate and an impurity opposite in conductivity type to that in the channel region in the SOI layer SL is injected after forming the sacrifice oxide film SO in order to reduce the resistance value of the SOI layer beneath the FS gate electrode.

Further, superimposition check marks used for checking the forming position of the FS gate electrode will be also discussed in this preferred embodiment.

<4-1. Device Construction>

Figure 25:
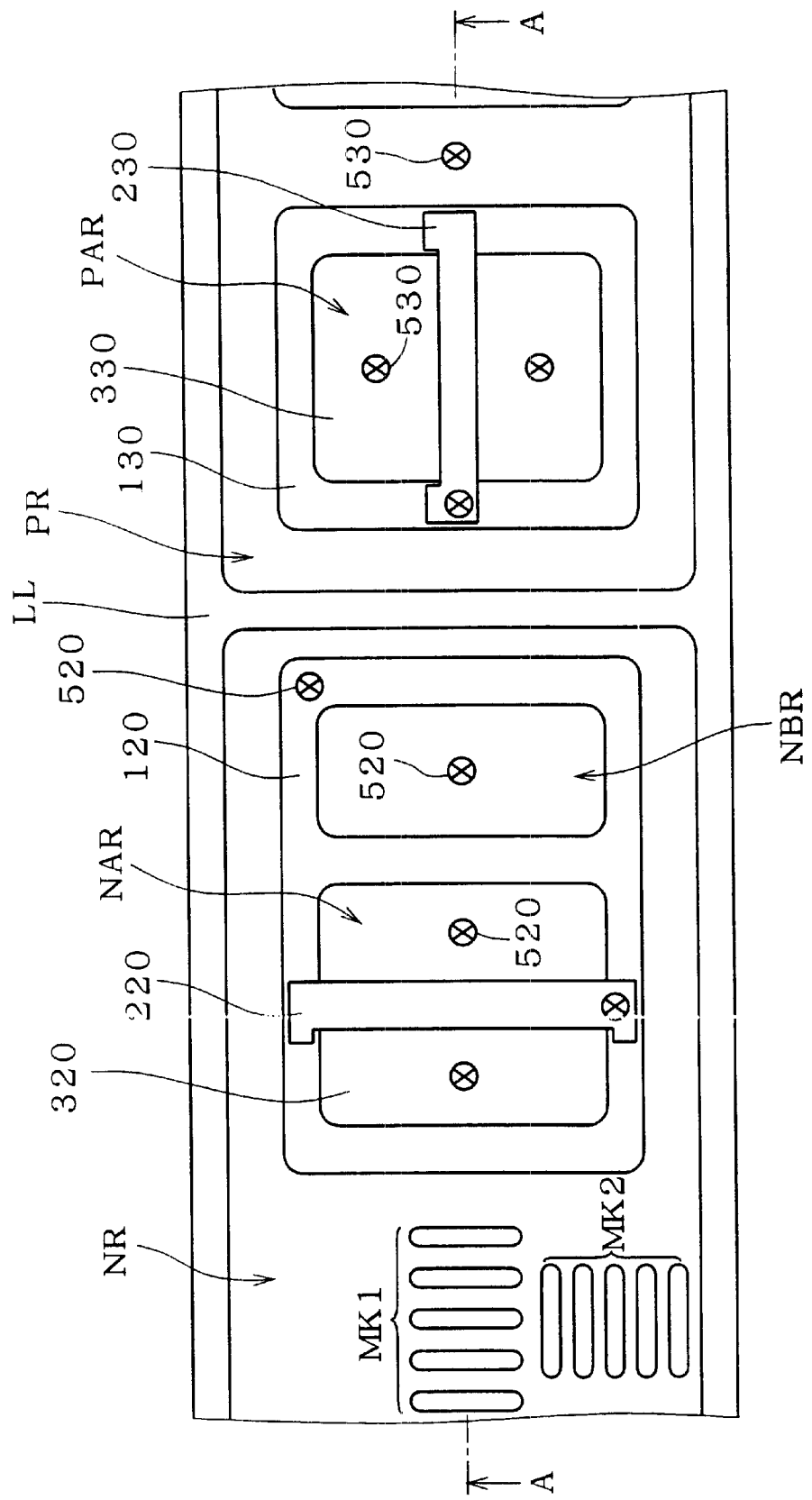
FIG. 25 is a plan view showing a construction of a semiconductor device in accordance with a fourth preferred embodiment of the present invention.

FIG. 25 is a plan view showing a construction of a CMOS transistor with field-shield isolation structure. In an NMOS transistor formation region NR of FIG. 25, defining an active region NAR and a body electrode formation region NBR, a field-shield (FS) gate electrode 120 is formed like a rectangular ring to make a field-shield isolation structure and a gate electrode 220 of the NMOS transistor is formed above the active region NAR so as to halve the active region NAR.

The active regions NAR externally located on both sides of the gate electrode 220 are regions to serve as source/drain (S/D) regions 320 and contact holes 520 are formed in the S/D regions 320 respectively. The contact holds 520 are also formed in an edge portion along the length of the gate electrode 220 and in a corner of the FS gate electrode 120.

Further, superimposition check marks MK1 and MK2 for checking the forming position of the FS gate electrode are arranged in the NMOS transistor formation region NR.

In a PMOS transistor formation region PR formed next to the NMOS transistor formation region NR, defining a PMOS transistor active region PAR, a field-shield (FS) gate electrode 130 is formed like a rectangular ring to make a field-shield isolation structure and a gate electrode 230 of the PMOS transistor is formed above the active region PAR so as to halve the active region PAR.

The active regions PAR externally located on both sides of the gate electrode 230 are regions to serve as source/drain (S/D) regions 330 and contact holes 530 are formed in the S/D regions 330 respectively. The contact hold 530 is also formed in an edge portion along the length of the gate electrode 230. The contact hole 530 close to the FS gate electrode 130 is connected to the body electrode (not shown).

The NMOS transistor formation region NR and the PMOS transistor formation region PR are electrically isolated from each other with an LOCOS (Local Oxidation of Silicon) layer LL.

Further, insulating layers are provided on the NMOS transistor formation region NR and the PMOS transistor formation region PR but not shown in this figure, for convenience of illustration, to allow main elements to be clearly seen.

Figure 26:
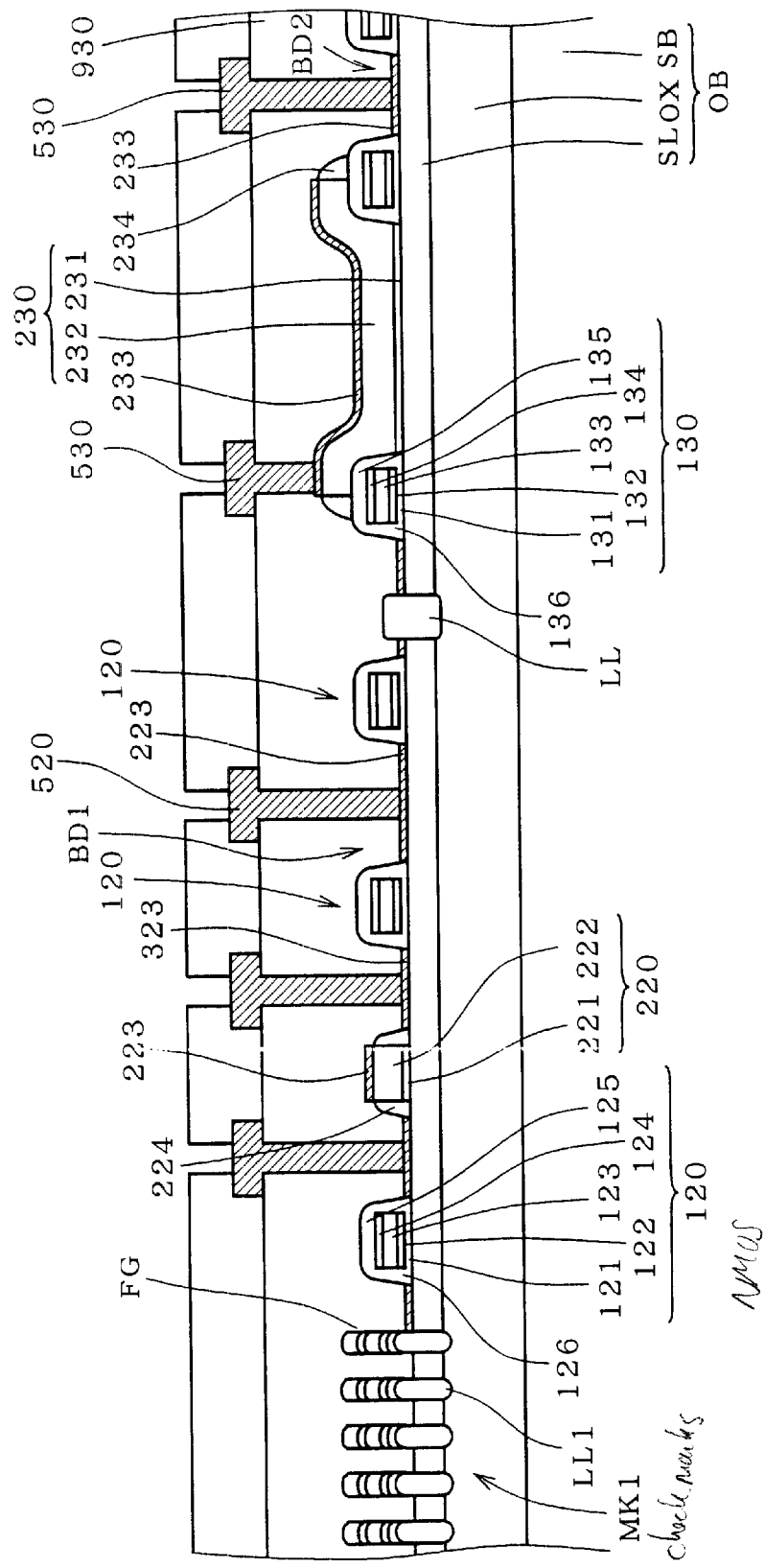
FIG. 26 is a cross section showing the construction of the semiconductor device in accordance with the fourth preferred embodiment of the present invention.

FIG. 26 is a cross section taken along the lines A—A of FIG. 25. In this figure, all the elements are formed on the SOI substrate OB. The SOI substrate OB consists of the silicon substrate SB, the buried oxide layer OX formed on the silicon substrate SB and the SOI layer SL formed on the buried oxide layer OX. Furthermore, the SOI substrate OB may be formed by SIMOX (Separation by Implanted Oxygen), wafer bonding and any other methods.

In the NMOS transistor formation region NR, the FS gate electrode 120 has an FS gate oxide film 121 formed on the surface of the SOI layer SL, an FS lower nitride film 122, a polysilicon layer 123, an FS upper nitride film 124 and an FS upper oxide film 125 which are formed on the FS gate oxide film 121 in this order, and side wall films 126 are formed on the side surfaces of these films and layer.

The electrode 220 has a gate oxide film 221 formed on the surface of the SOI layer SL and a polysilicon layer 222 formed on the gate oxide film 221, and a salicide layer 223 is formed on the polysilicon layer 222 and side wall oxide films 224 are formed on the side walls of these films and layers. Regions inside the surface of the SOI layer SL externally located on both sides of the gate electrode 220 serves as S/D regions 320. Inside the S/D region 320, an S/D layer and an LDD layer are formed (not shown). The surface of the S/D region 320 is covered with a salicide layer 323. The surface of the SOI layer SL in the body electrode formation region NBR is covered with the salicide layer 223, to serve as a body electrode BD1.

The superimposition check marks MK1 and MK2 (not shown) are made of LOCOS layers LL1 and on each LOCOS layer LL1, an FS gate electrode multilayered element FG like the FS gate electrode 120 is formed to make a field-shield isolated structure.

In the PMOS transistor formation region PR, a gate oxide film 231 is formed on the surface of the SOI layer SL between two FS gate electrodes 130, and a polysilicon layer 232 is formed so as to cover the upper portion of the gate oxide film 231 and partially cover the upper portion of the FS gate electrode 130. A salicide film 233 is formed on the polysilicon layer 232 and side wall oxide films 234 are formed on both sides these film and layer. The surface of the SOI layer SL near the FS gate electrode 130 is covered with the salicide layer 233, to serve as a body electrode BD2.

The FS gate electrode 130 has an FS gate oxide film 131 formed on the surface of the SOI layer SL, an FS lower nitride film 132, a polysilicon layer 133, an FS upper nitride film 134 and an FS upper oxide film 135 which are formed on the FS gate oxide film 131 in this order, and side wall oxide films 136 are formed on the side walls of these films and layer.

An interlayer insulating film 930 is formed over the FS gate electrode 130 and the gate electrode 230, and contact holes 520 are connected to the S/D regions 320 and the body electrode BD1 and contact holes 530 are connected to the gate electrode 230 and the body electrode BD2.

<4-2. Manufacturing Method>

With reference to FIGS. 27 to 42, a method for manufacturing the semiconductor device with field-shield isolation structure will be discussed.

Figure 27:
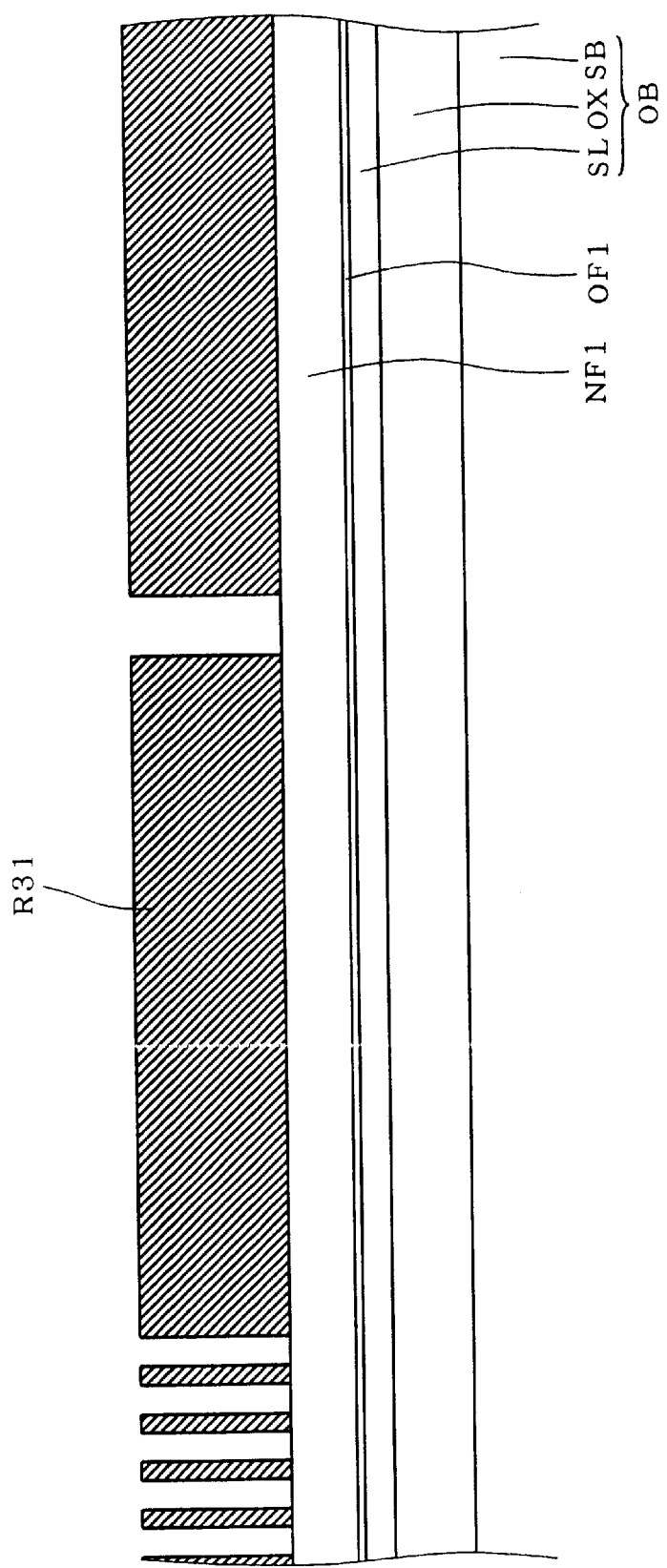

In the step of FIG. 27 an oxide film OF1 is formed by CVD and or thermal oxidation at the temperature of 800° C. to have a thickness of 100 to 300 Å.

Subsequently, a nitride film NF1 is formed by CVD, for example, at the temperature of 700° C. to have a thickness of 1000 to 2000 Å. A resist mask R31 is formed on the nitride film NF1.

Figure 28:
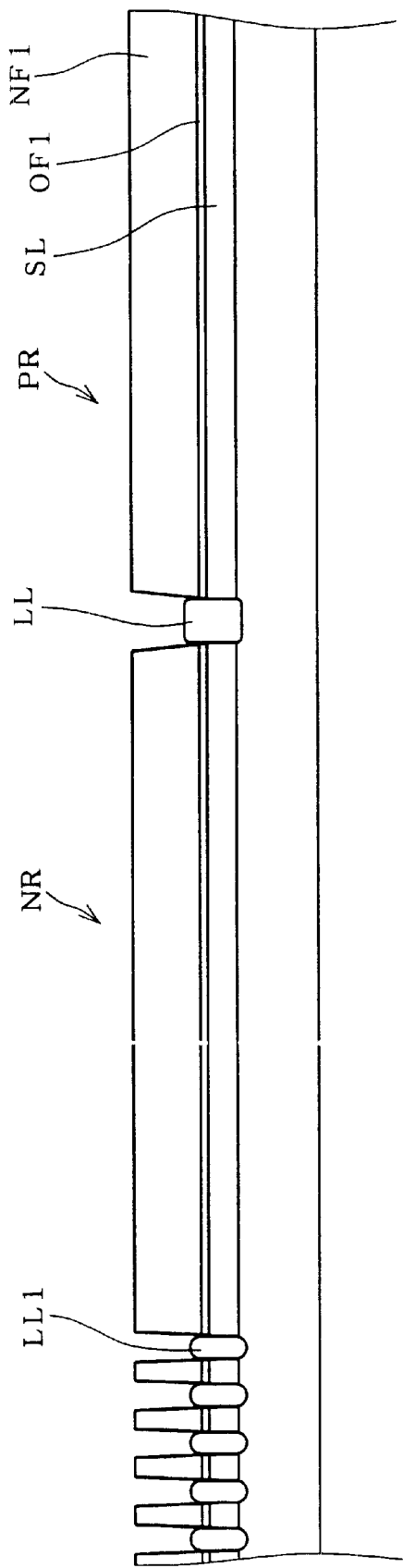

With the resist mask R31, the nitride film NF1 is patterned by etching. After removing the resist mask R31, an LOCOS oxidation is performed using the nitride film NF1 as a mask to form the LOCOS layer LL for electric isolation of the SOI layer SL, as shown in FIG. 28. To suppress a latch-up, herein, the SOI layer SL is separated into the NMOS transistor formation region NR and the PMOS transistor formation region PR At this time, the LOCOS layers LL1 are formed, to serve as the superimposition check marks MK1 and MK2. After LOCOS oxidation, the nitride film NF1 is removed by thermal phosphoric acid.

Subsequently, in the step of FIG. 29, a resist mask R32 is formed in the PMOS transistor formation region PR and a channel is injected into the NMOS transistor formation an region NR. This channel injection is performed, for example, with boron ions at an energy of 10 to 30 KeV at a dose of $1\times10^{12}$ to $1\times10^{14}/cm^2$.

Figure 30:
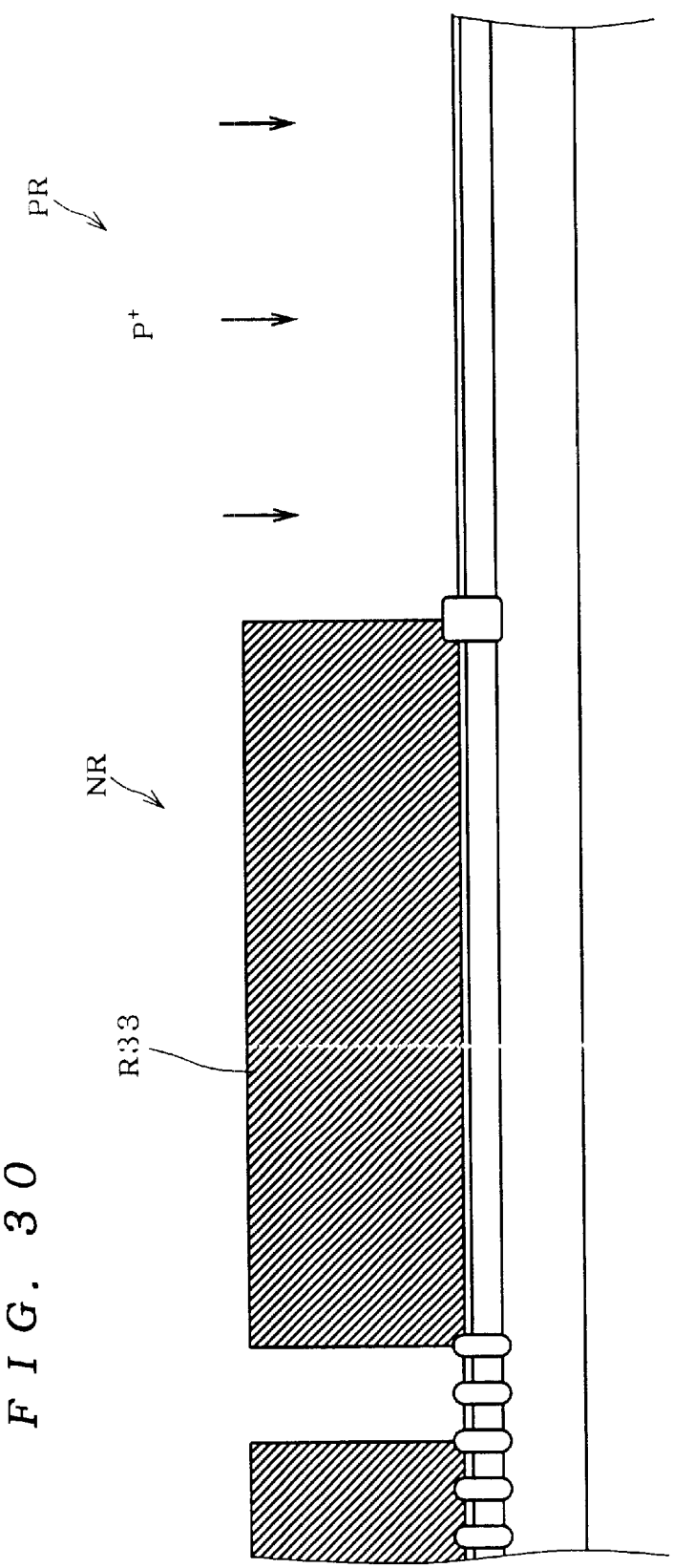

Then, in step of FIG. 30, a resist mask R33 is formed in the NMOS transistor formation region NR, and a channel is injected into the PMOS transistor formation region PR. This channel injection is performed, for example, with phosphorous ions at an energy of 20to 60 KeV at a dose of $1\times10^{12}$ to $1\times10^{14}/cm^2$.

Thus, since the channel injection is performed before forming the FS gate electrode, it is possible to make the impurity concentration in the channel injection region uniform. Moreover, the impurity is not injected into the buried oxide layer OX since the impurity injection is performed at the energy suitable for the SOI layer SL.

Furthermore, to partly control the impurity concentration in the channel injection region, the impurity concentration may be substantially lowered by absorbing the impurity with the sacrifice oxide film SO as discussed in the second preferred embodiment or by injecting the ion opposite in conductivity type to the injected ion in the channel as discussed in the third preferred embodiment. The method will be discussed in a later process.

Figure 29:
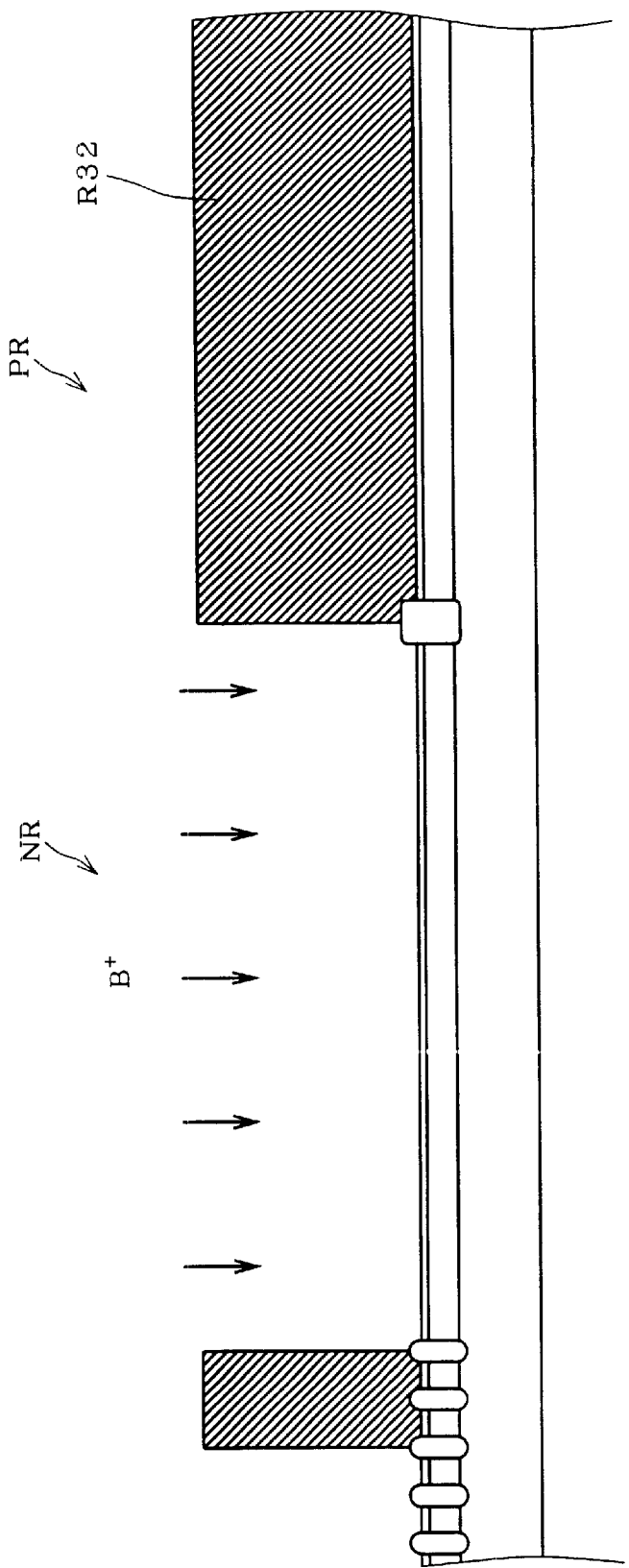

Herein, the LOCOS layers LL1 serving as the superimposition check marks MK1 and MK2 are used for alignment of the positions for forming the resist masks R32 and R33, as shown in FIGS. 29 and 30.

After the channel injections, annealing may be performed at the temperature of 820° C. in nitrogen atmosphere for 5 to 30 minutes, to resolve variation in crystallinity of the SOI layer SL, for improvement in uniformity of the transistor characteristics.

Figure 31:
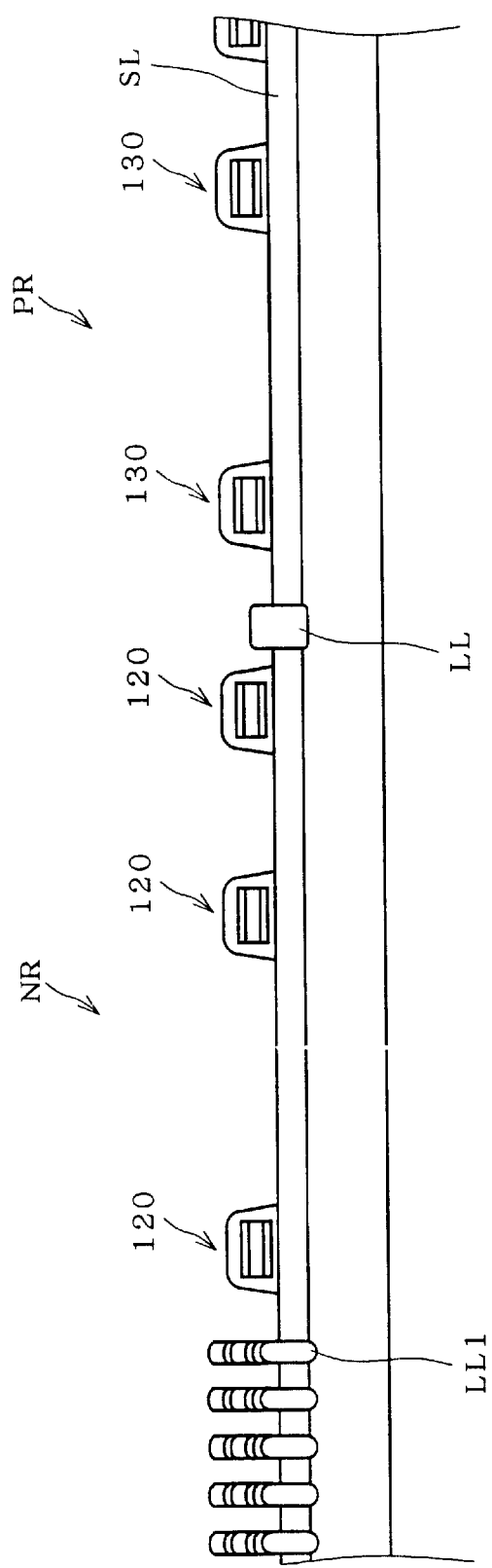

After removing the oxide film OF1, the FS gate electrodes 120 and 130 are formed in the step of FIG. 31. Detailed discussion was presented on the method for manufacturing the FS gate with reference to FIGS. 18 to 22 in the third preferred embodiment, so will be herein omitted.

When the FS gate is formed, in order to prevent deviation, it is necessary to make a precise alignment of a resist mask used for forming the FS gate. For this reason, using the superimposition check marks MK1 and MK2 (not shown) made of the LOCOS layers LL1 to check deviation, the disposing position of an exposure mask is determined. The use of the superimposition check marks MK1 and MK2 will be discussed later.

Furthermore, when the FS gate electrodes 120 and 130 are formed, the sacrifice oxide film SO is formed on the surface of the SOI layer SL because the SOI layers SL near the edge portions of the side wall oxide films 126 and 136 are scooped out.

Figure 32:
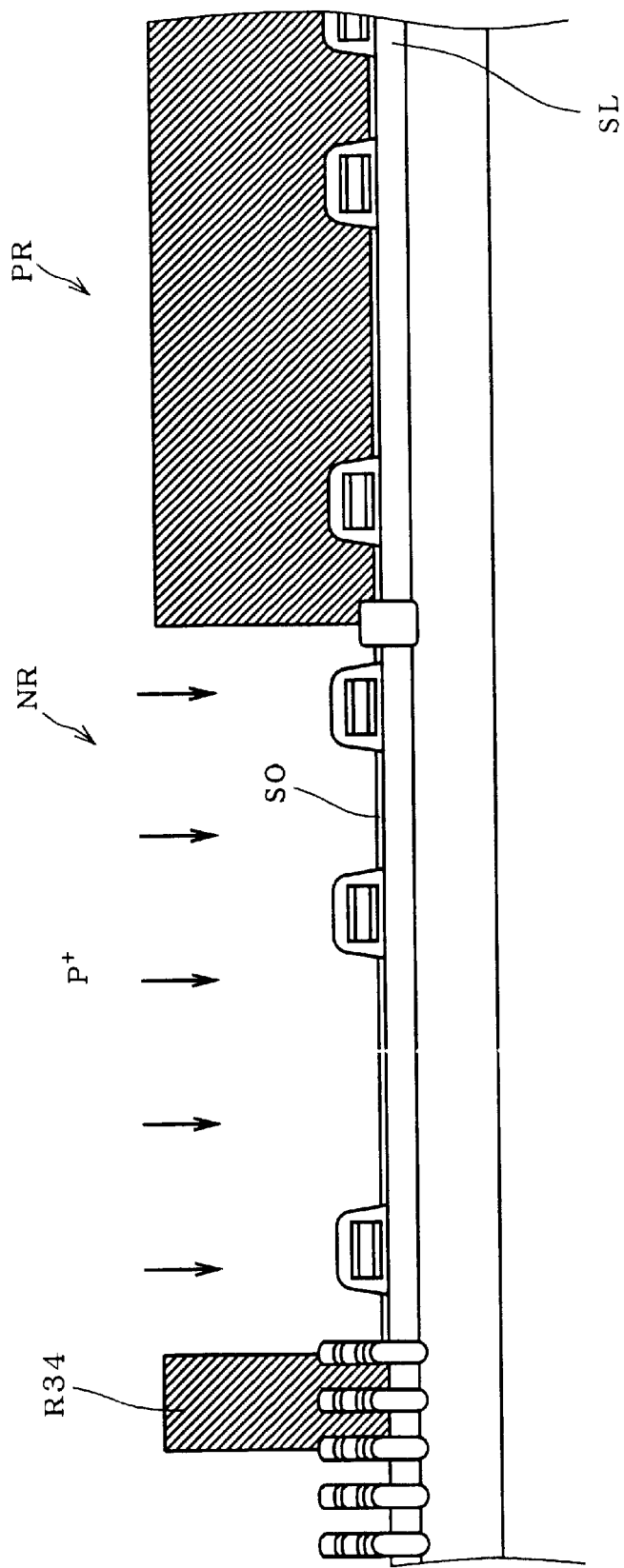

In the step of FIG. 32, a resist mask R34 is formed in the PMOS transistor formation region PR and an impurity opposite in conductivity type to that in the channel region of the NMOS transistor is injected into the NMOS transistor formation region NR. For example, when the SOI layer SL has a thickness of 1000 Å, if boron is injected as channel at a dose of $1\times10^{14}/cm^2$, phosphorus is injected at a dose of $9.5\times10^{13}/cm^2$, so that the impurity concentration in the channel region substantially becomes $5\times10^{17}/cm^3$. On the other hand, the impurity concentration in the SOI layer SL beneath the FS gate electrode 120 keeps about $1\times10^{19}/cm^3$.

Figure 33:
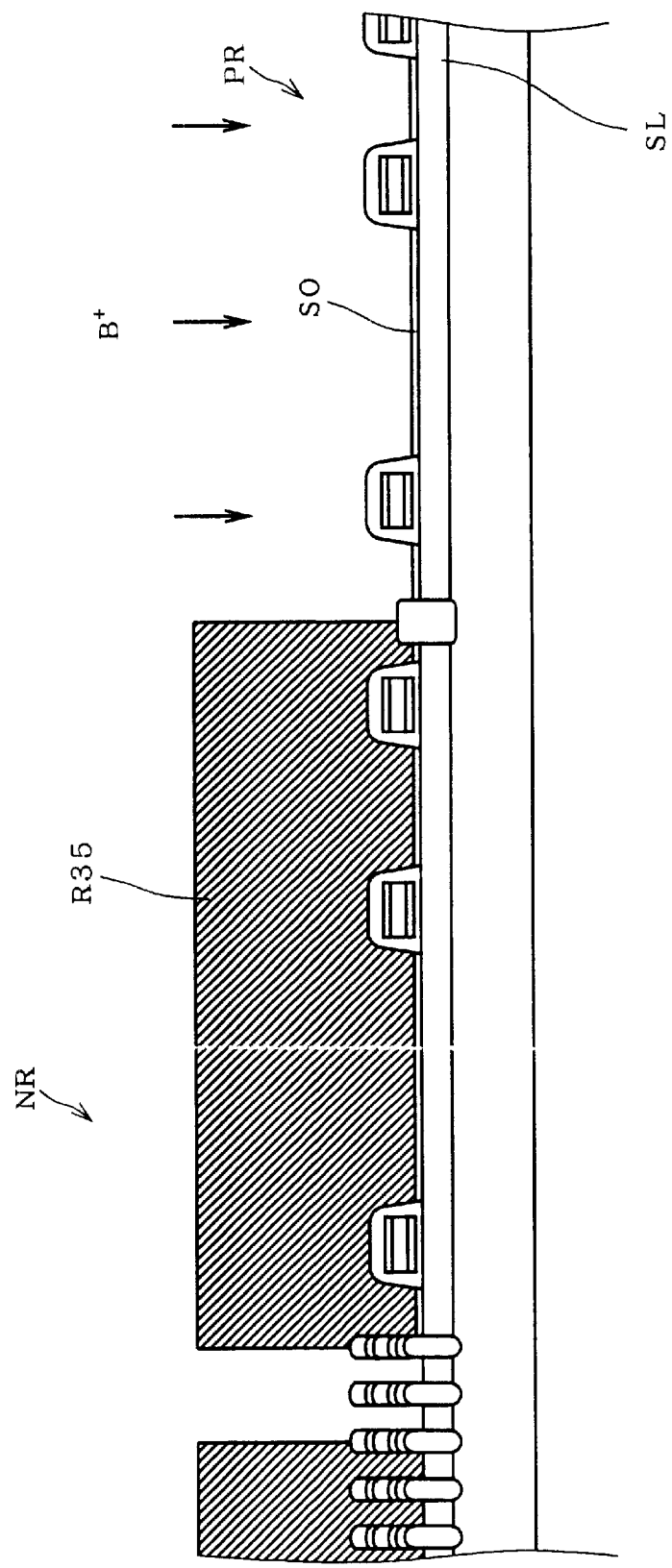

In the step of FIG. 33, a resist mask R35 is formed in the NMOS transistor formation region NR and an impurity opposite in conductivity type to that in the channel region of the PMOS transistor is injected into the PMOS transistor formation region PR. In this case, boron is injected.

Figure 34:
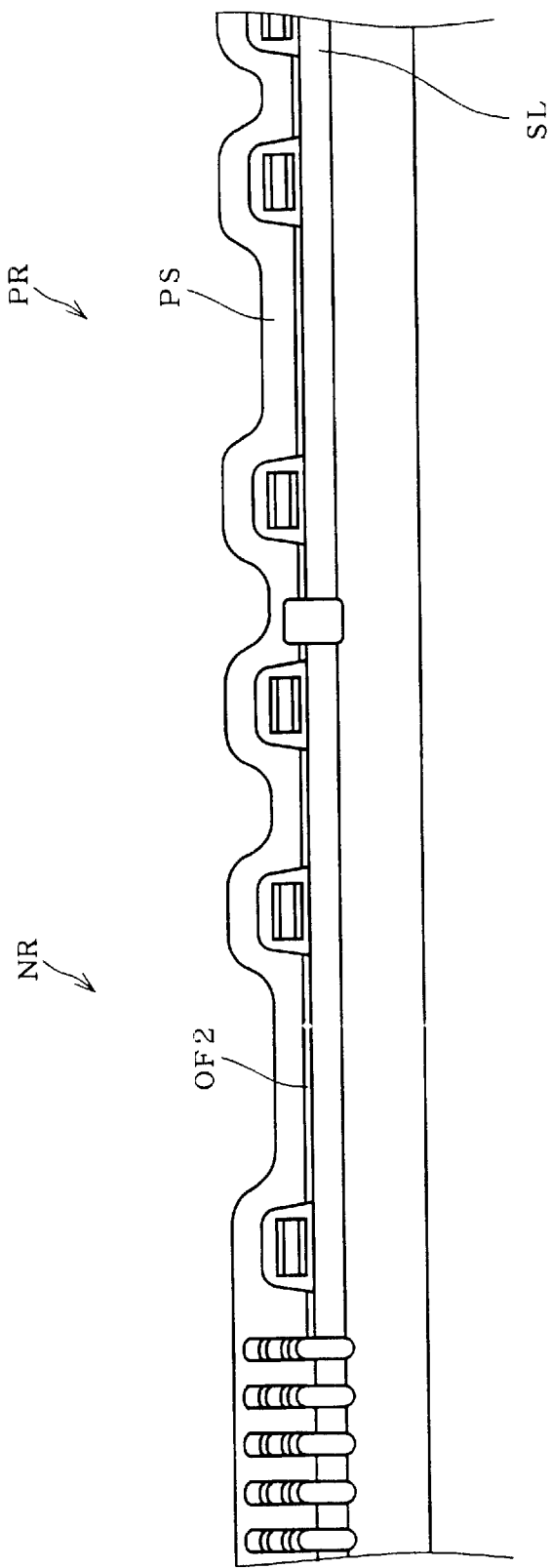

After removing the sacrifice oxide film SO, in the step of FIG. 34, gate oxidation is performed to form an oxide film OF2 which is to become the gate oxide films 221 and 231 on the surface of the SOI layer SL. After that, a polysilicon layer PS which is to become the gate electrode is formed so as to have a thickness of 1000 to 3000 Å.

Figure 35:
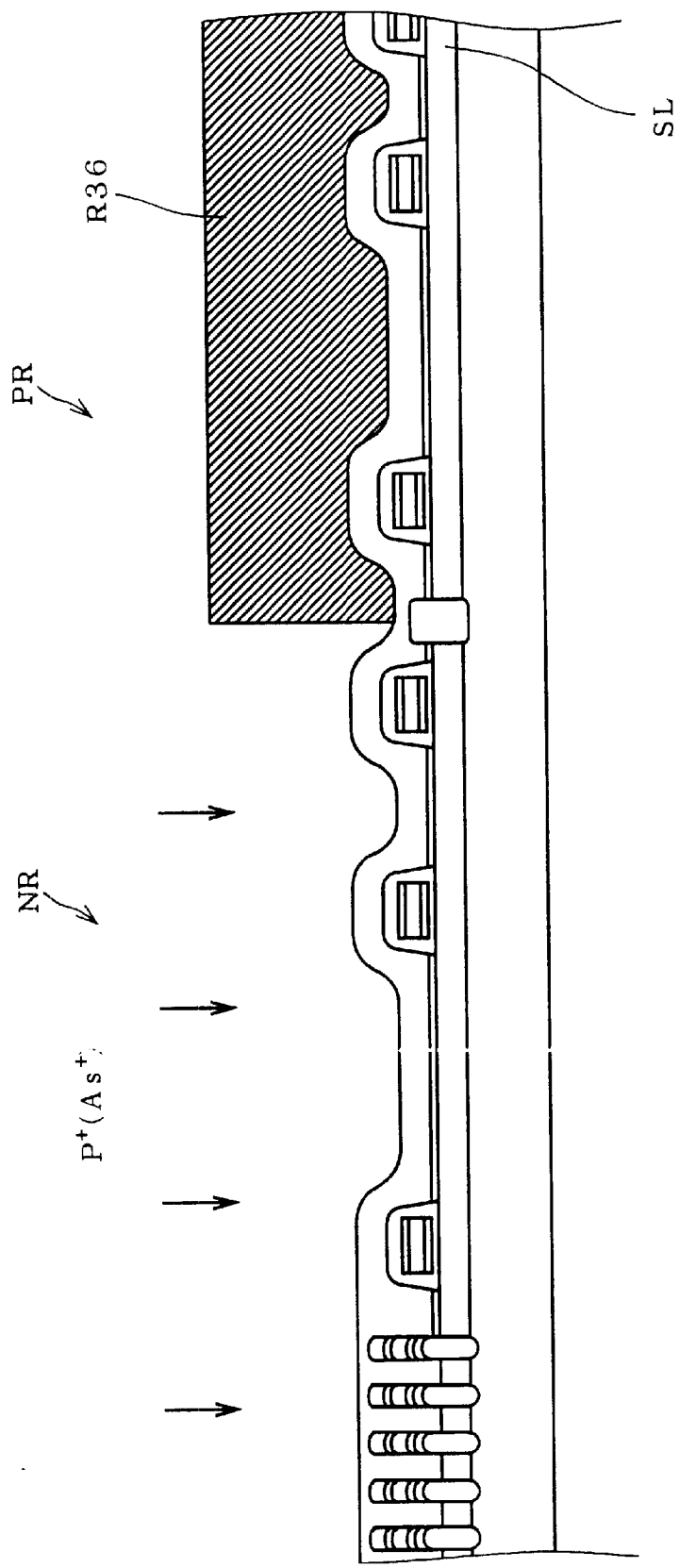

In the step of FIG. 35, a resist mask R36 is formed in the PMOS transistor formation region PR and an impurity ion is injected into the polysilicon layer PS in the NMOS transistor formation region NR. This injection is performed with phosphorus or arsenic at an energy of 5 to 20 KeV at a dose of $3\times10^{15}$ to $8\times10^{15}/cm^2$.

Figure 36:
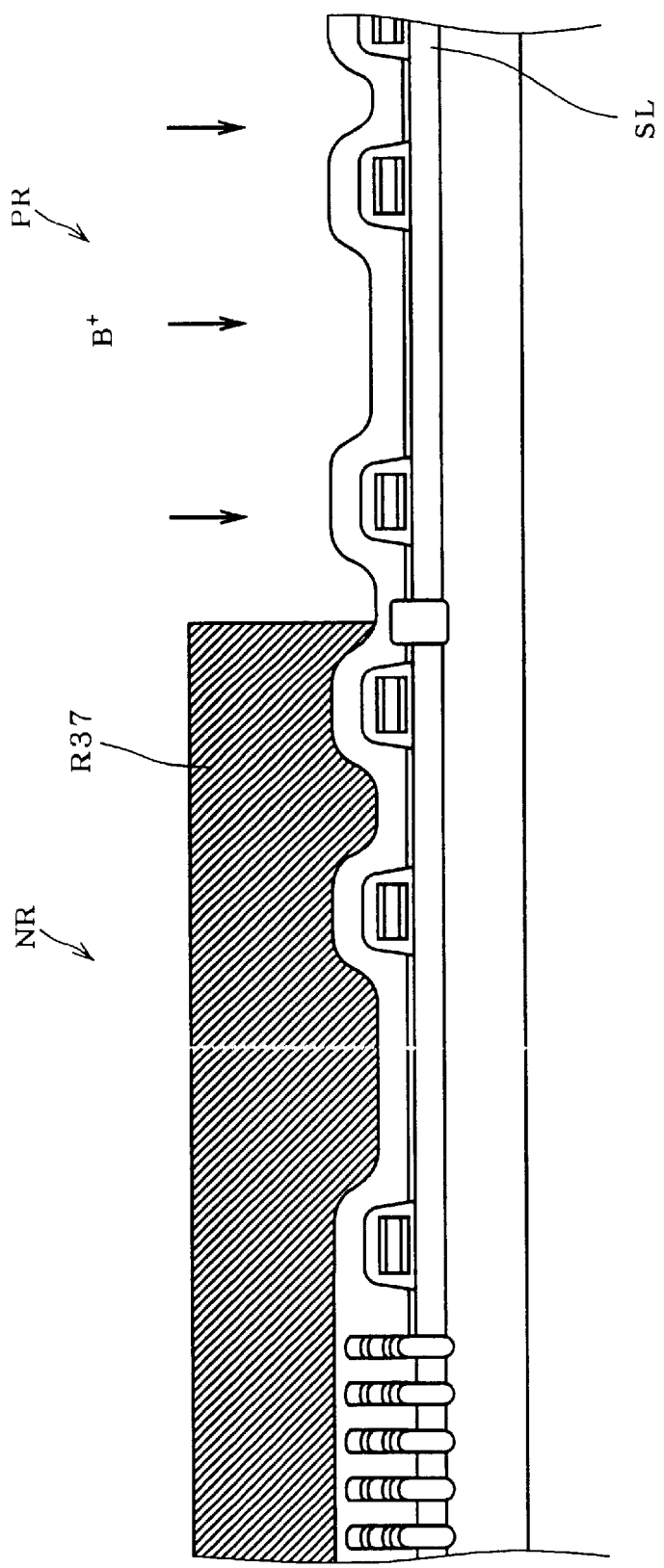

In the step of FIG. 36, a resist mask R37 is formed in the NMOS transistor formation region NR and an impurity ion is injected into the polysilicon layer PS in the PMOS transistor formation region PR. This injection is performed with boron at an energy of 5 to 20 KeV at a dose of $3\times10^{15}$ to $8\times10^{15}/cm^2$.

With these injections, a threshold voltage of a transistor is controlled and the resistance of the gate electrode is lowered. To activate the injected impurity, for example, annealing may be performed at the temperature of 850° C. for about 20 minutes. Furthermore, this annealing may be performed after a source/drain injection as discussed later.

Figure 37:
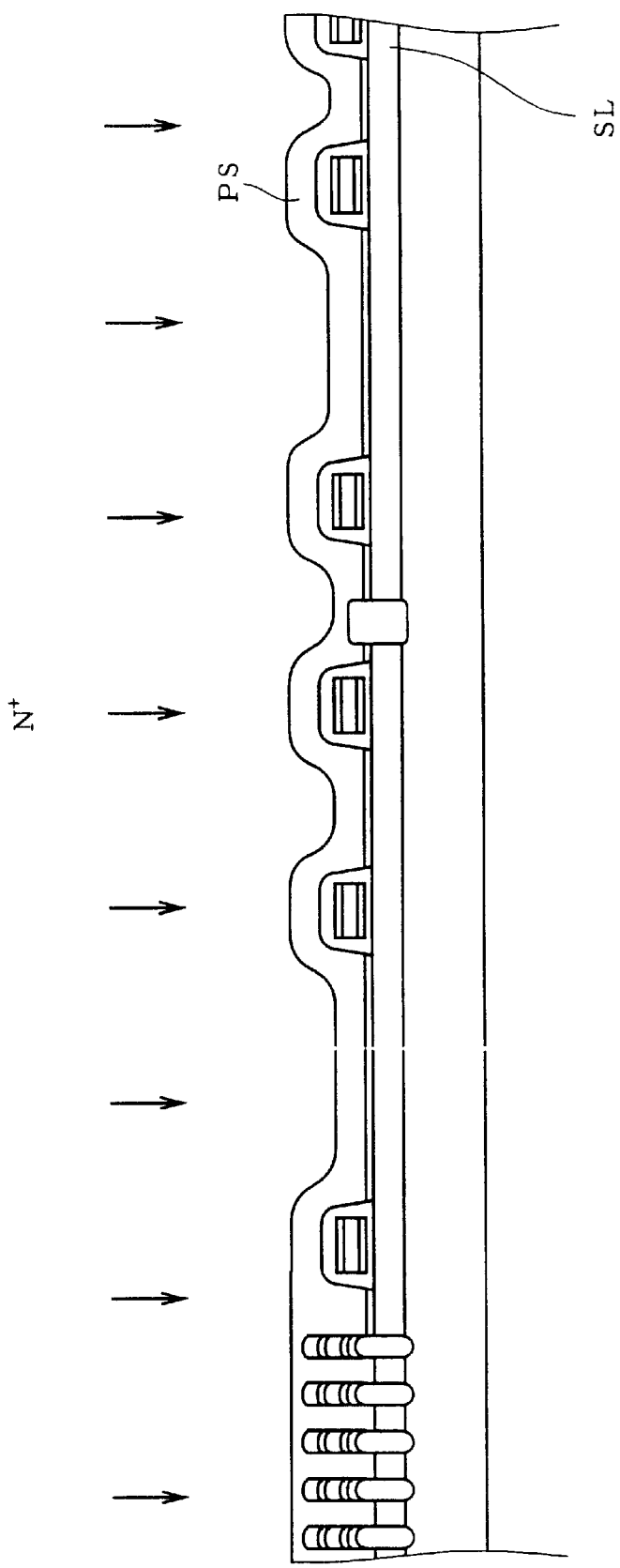

Subsequently, in the step of FIG. 37, nitrogen ions are injected into the polysilicon layer PS, to increase the reliability of the gate oxide film of MOS transistor. This nitrogen injection is performed at an energy of 5 to 30 KeV at a dose of $3\times10^{14}$ to $12\times10^{14}/cm^2$.

Subsequently, the polysilicon layer PS and the oxide film OF2 are patterned to form the polysilicon layers 222 and 232 and the gate oxide films 221 and 231. Thus, the gate electrodes 220 and 230 are obtained.

Figure 38:
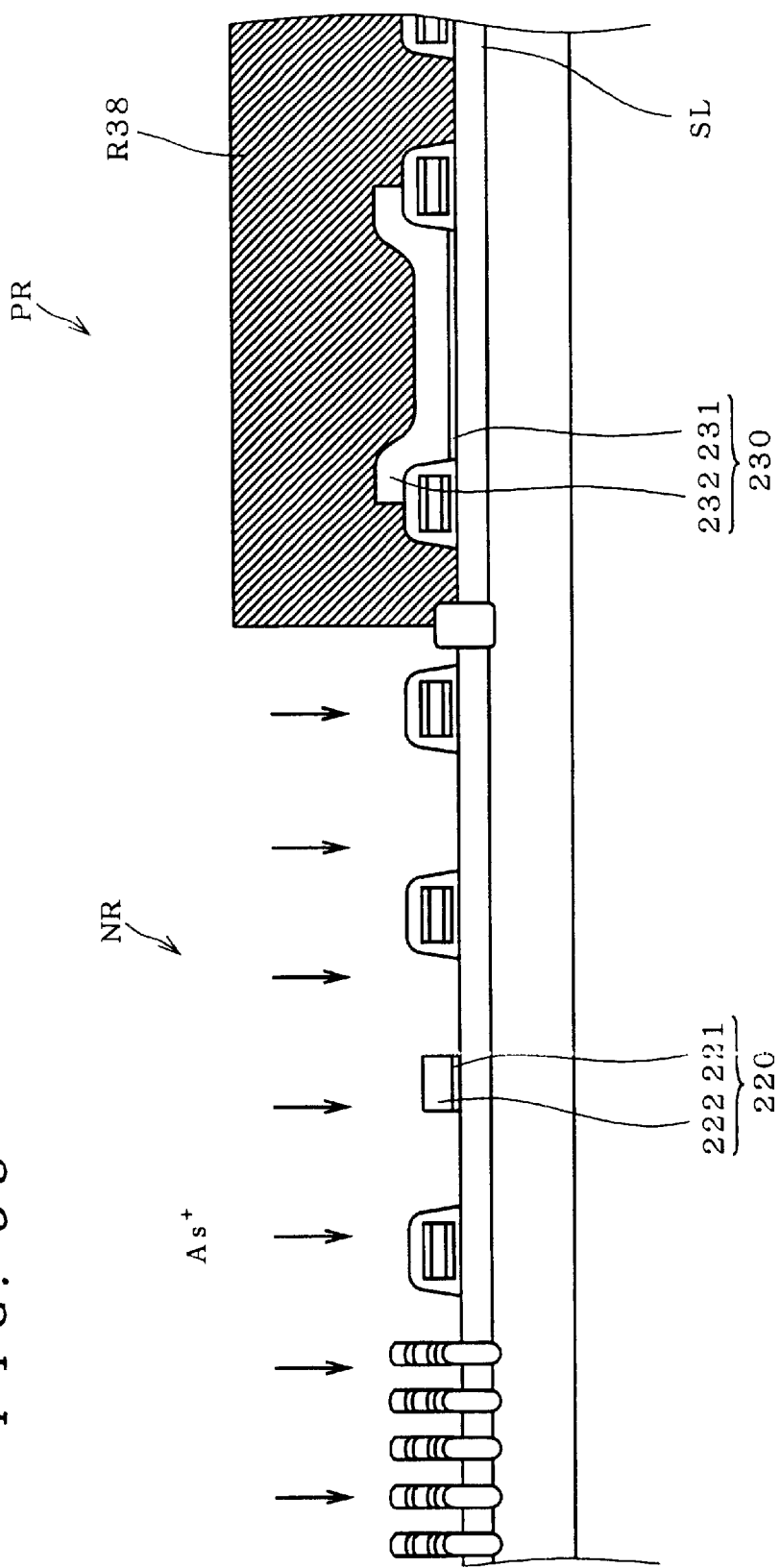

Then, in the step of FIG. 38, a resist mask R38 is formed in the PMOS transistor formation region PR and an LDD injection is performed into the SOI layer SL of the NMOS transistor formation region NR. This injection is performed, for example, with arsenic at an energy of 5 to 20 KeV at a dose of $0.1\times10^{12}$ to $10\times10^{12}/cm^2$.

Figure 39:
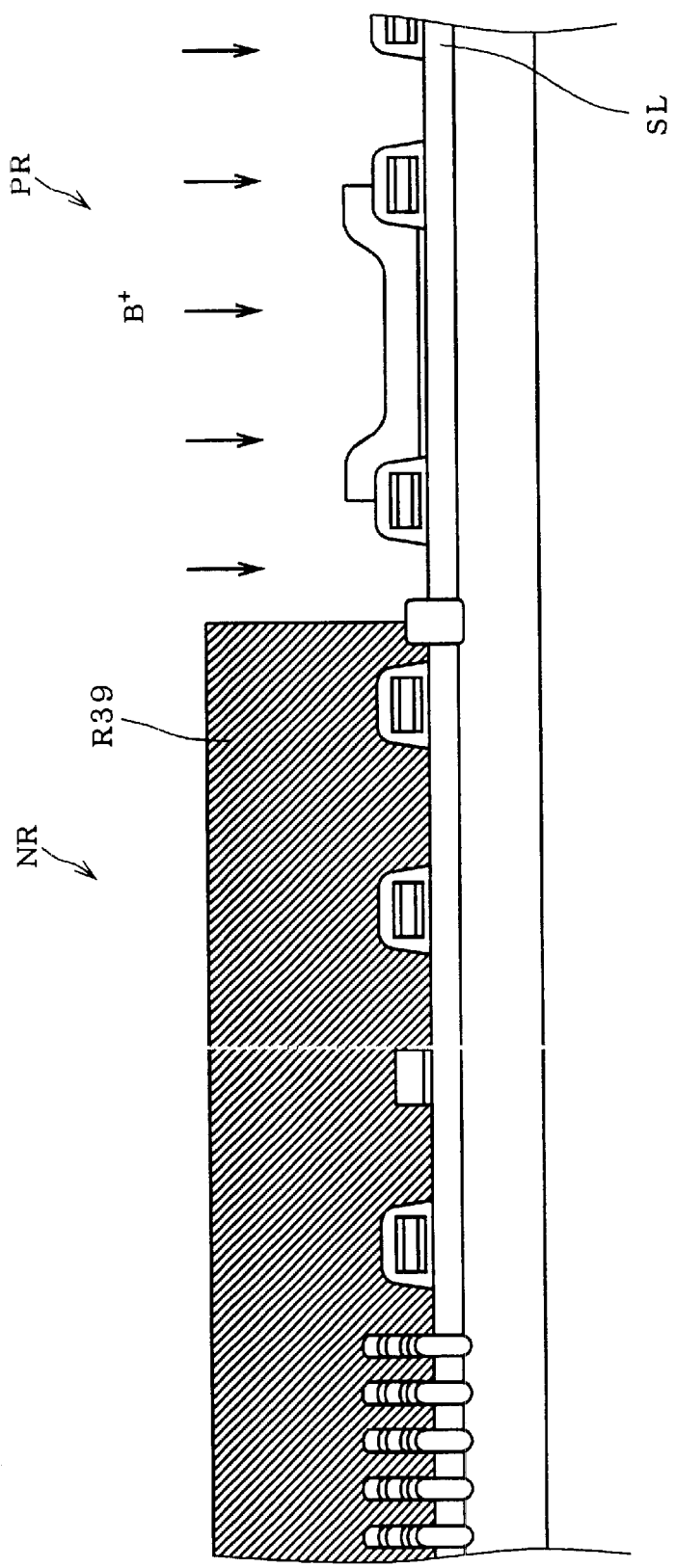
Figure 40:
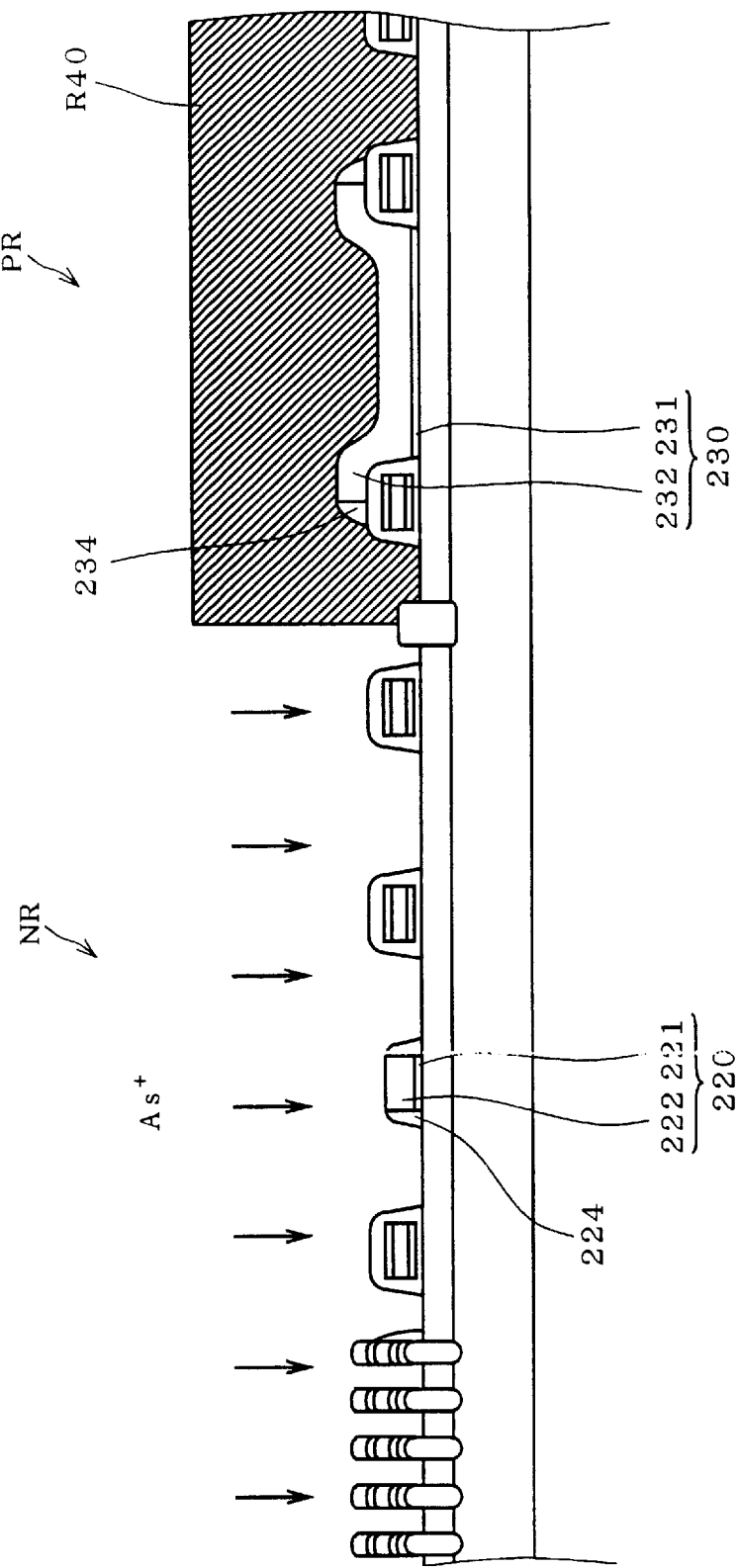

In the step of FIG. 39, a resist mask R39 is formed in the NMOS transistor formation region NR and an LDD injection is performed into the SOI layer SL of the PMOS transistor formation region PR. This injection is performed, for example, with boron at an energy of 5 to 20 KeV at a dose of $0.1\times10^{12}$ to $10\times10^{12}/cm^2$. Furthermore, after these injections, annealing may be performed at the temperature of 750 to 850° C. for several minutes.

After that, the side wall oxide films 224 and 234 are formed only on the side walls of the gate electrodes 220 and 230. Then, in the step of FIG. 40, a resist mask R40 is formed in the PMOS transistor formation region PR a source/drain is injected into the SOI layer SL of the NMOS transistor formation region NR. This injection is performed, for example, with arsenic at an energy of 5 to 20 KeV at a dose of $1\times10^{14}$ to $50\times10^{14}/cm^2$.

Figure 41:
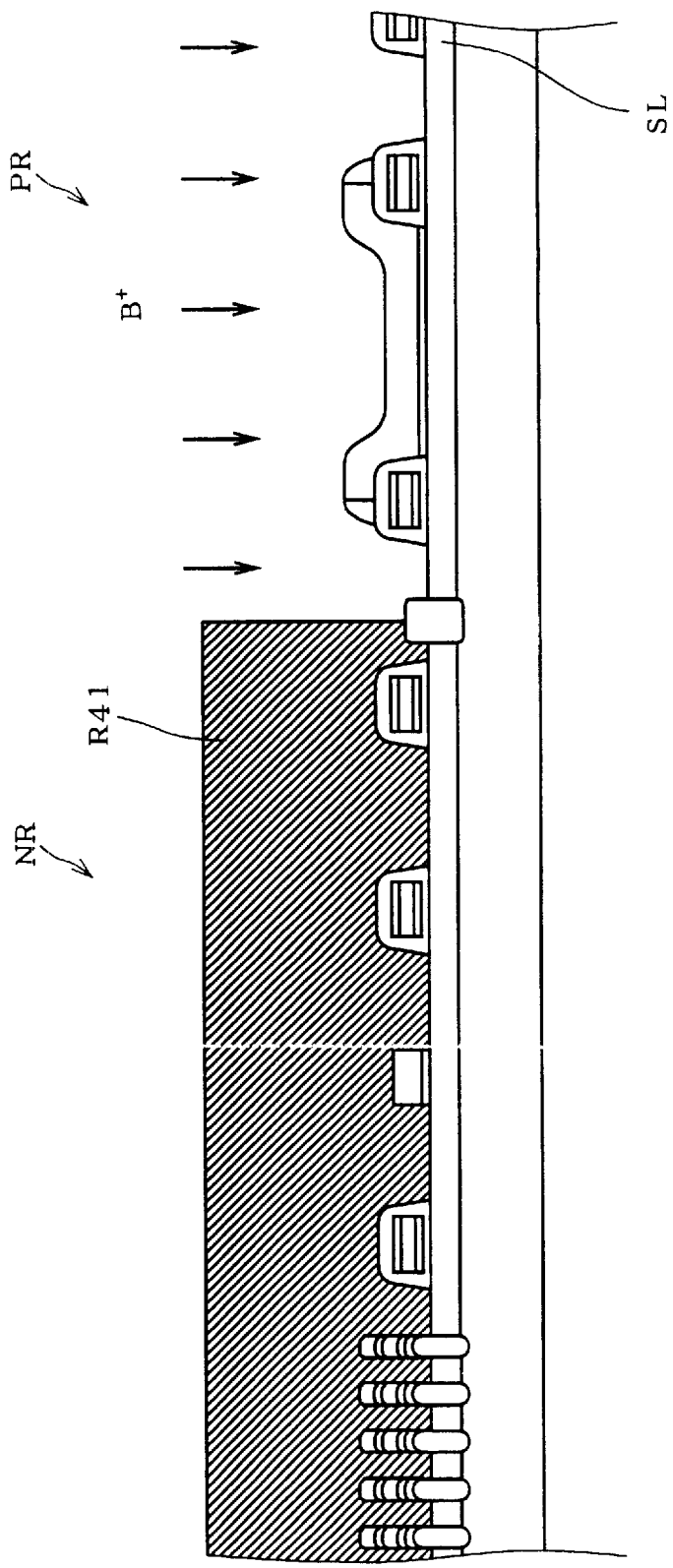
Figure 44:
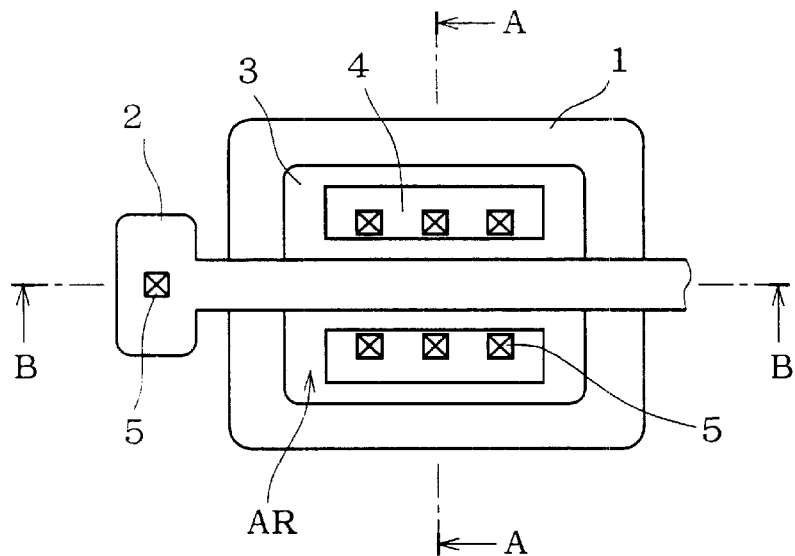
FIG. 44 is a plan view of a semiconductor device with field-shield isolation structure.
Figure 45:
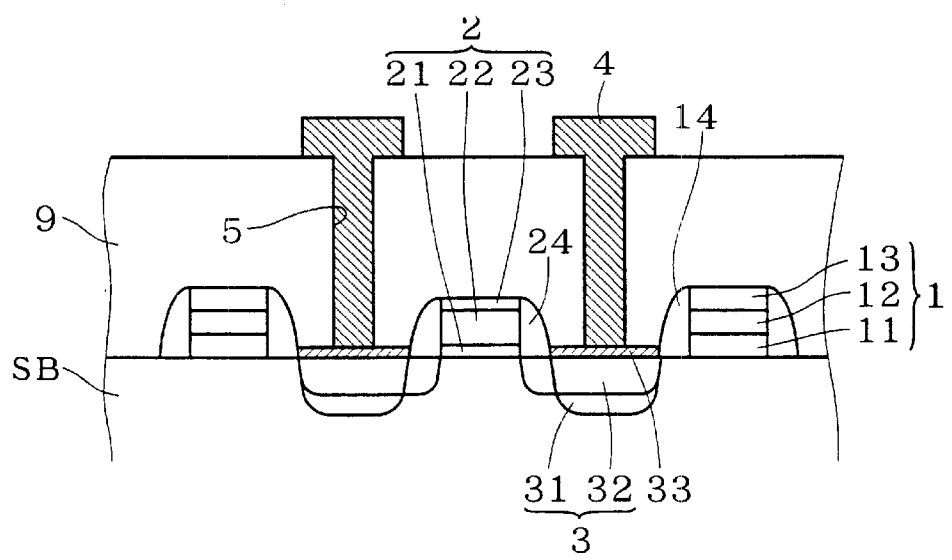
FIG. 45 is a cross section showing a construction of a background-art semiconductor device.
Figure 46:
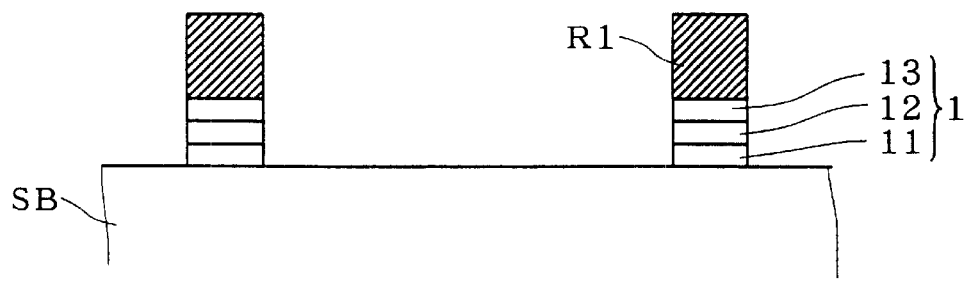
FIGS. 46 to 51 illustrate steps in a process for manufacturing the semiconductor device in the background art.
Figure 47:
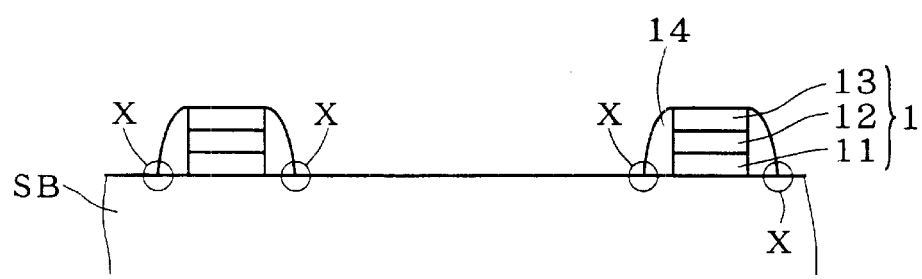
Figure 48:
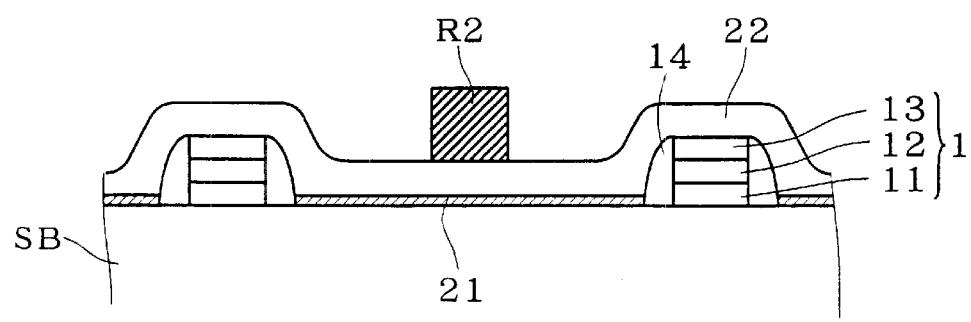
Figure 49:
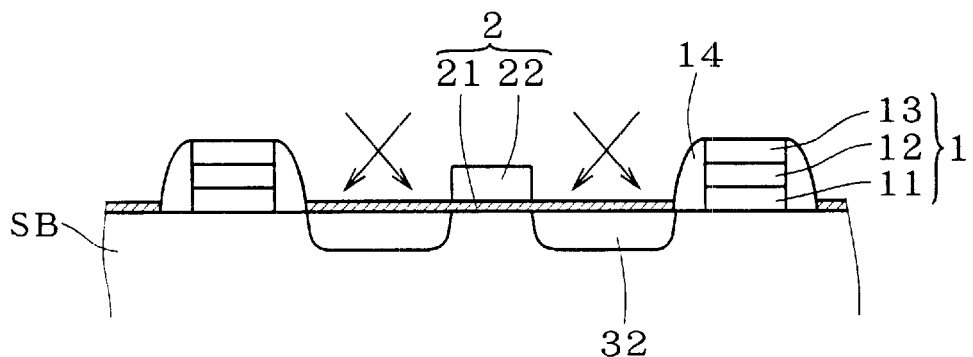
Figure 50:
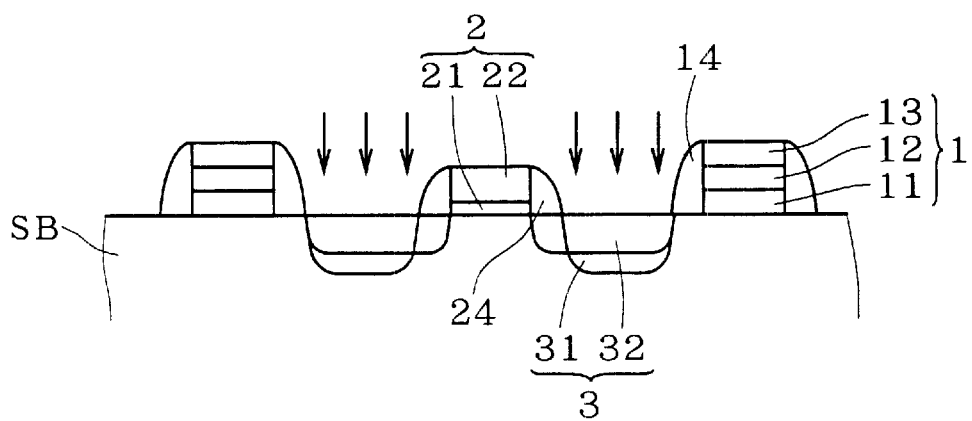
Figure 51:
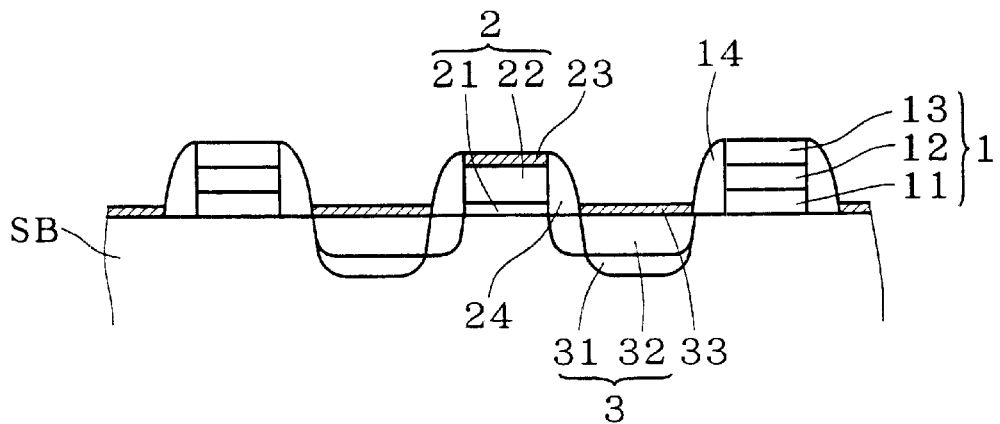
Figure 52:
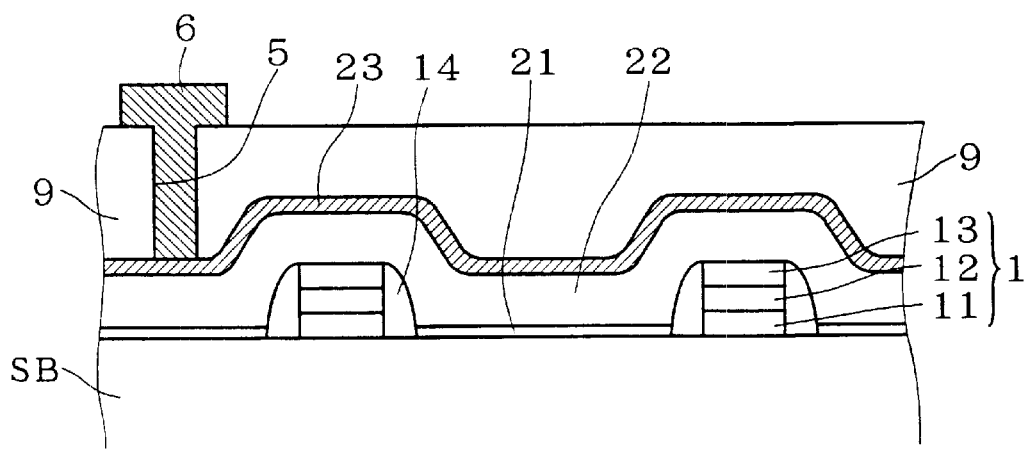
FIG. 52 is a cross section showing the construction of the background-art semiconductor device.
Figure 53:
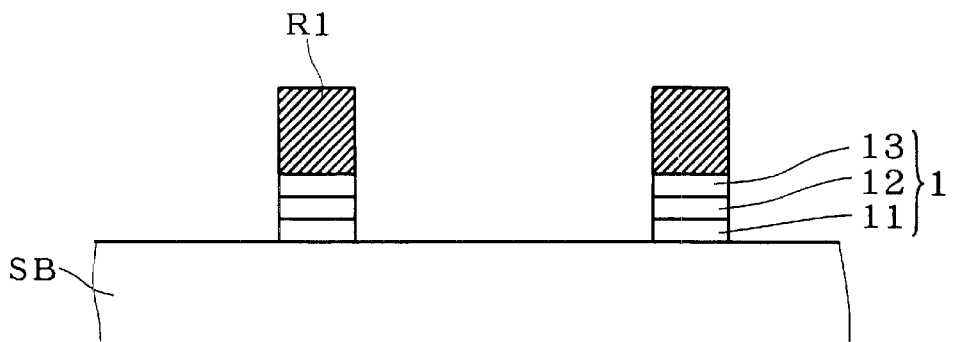
FIGS. 53 to 55 illustrate steps in a process for manufacturing the semiconductor device in the background art.
Figure 54:
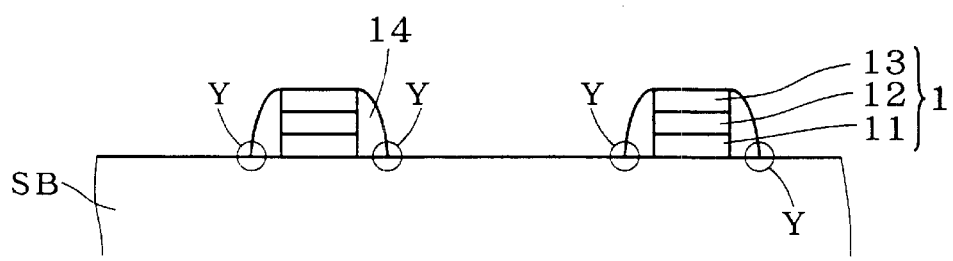
Figure 55:
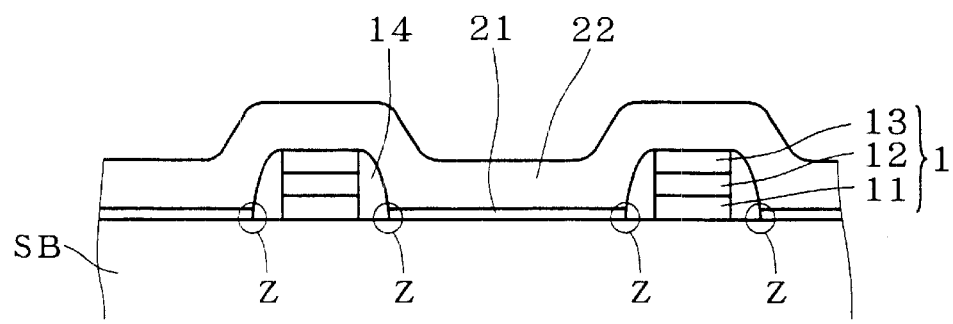
Figure 56:
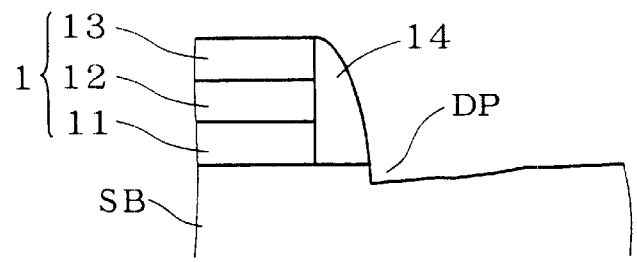
FIGS. 56 to 58 illustrate a problem of the background-art semiconductor device.
Figure 57:
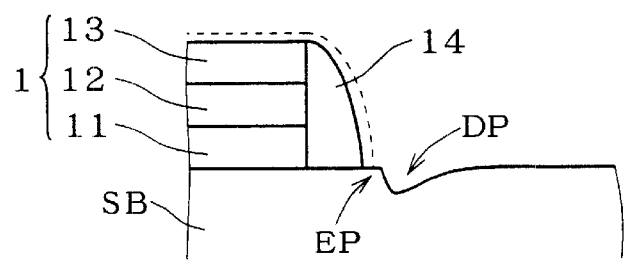
Figure 58:
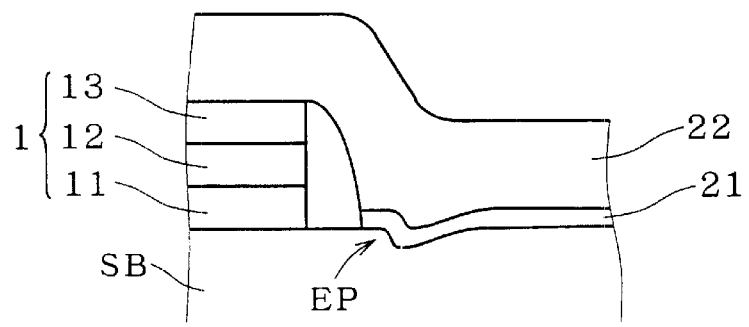
Figure 59:
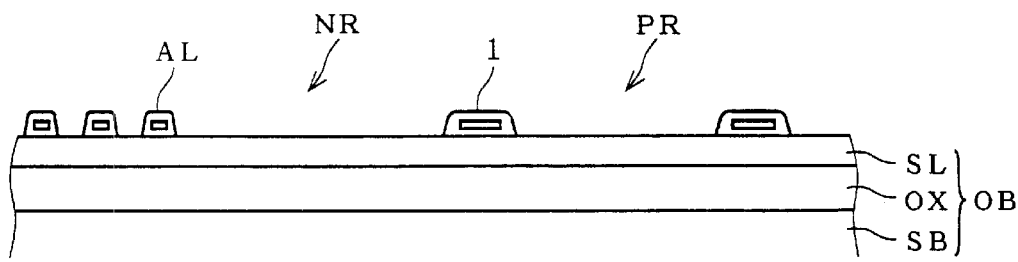
FIGS. 59 to 60 illustrate steps in a process of injecting a channel in the background art.
Figure 60:
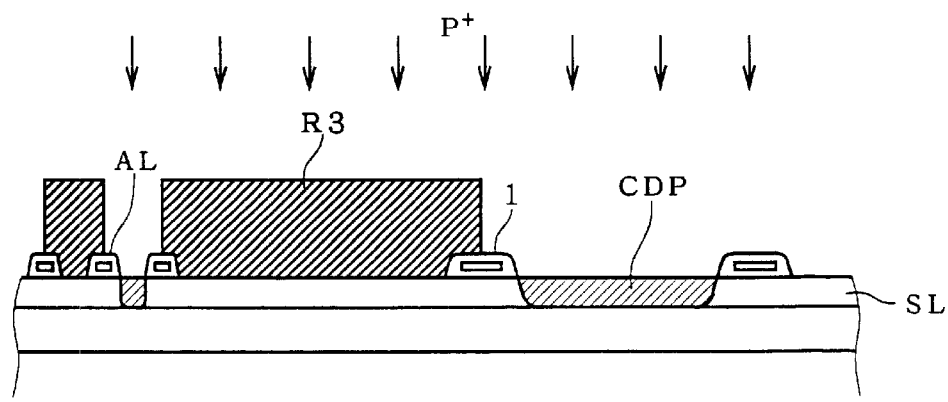
Figure 61:
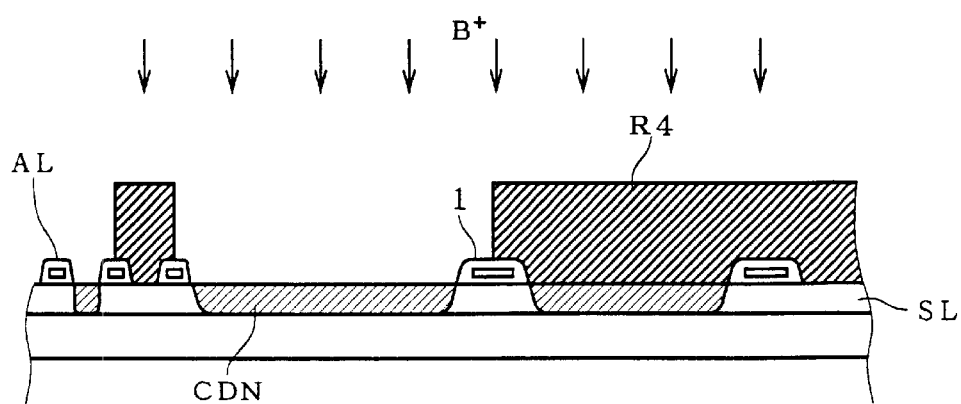
Figure 62:
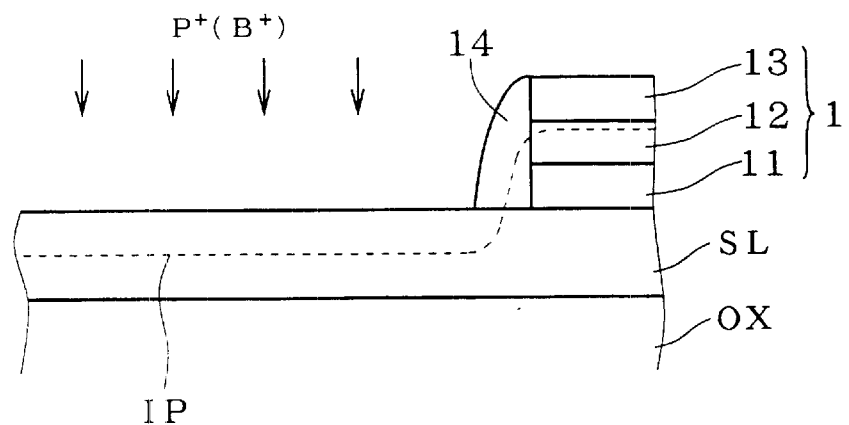
FIGS. 62 to 64 illustrate a problem of the background-art channel injection process.
Figure 63:
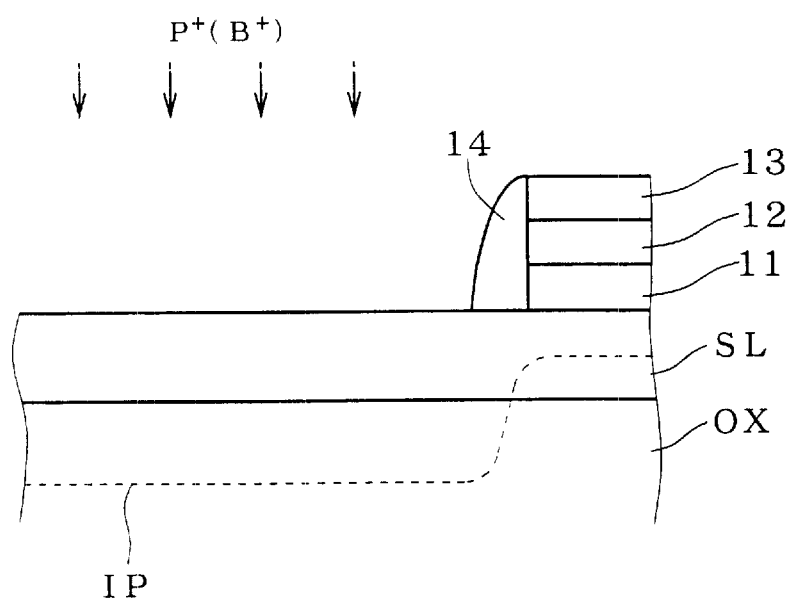
Figure 64:
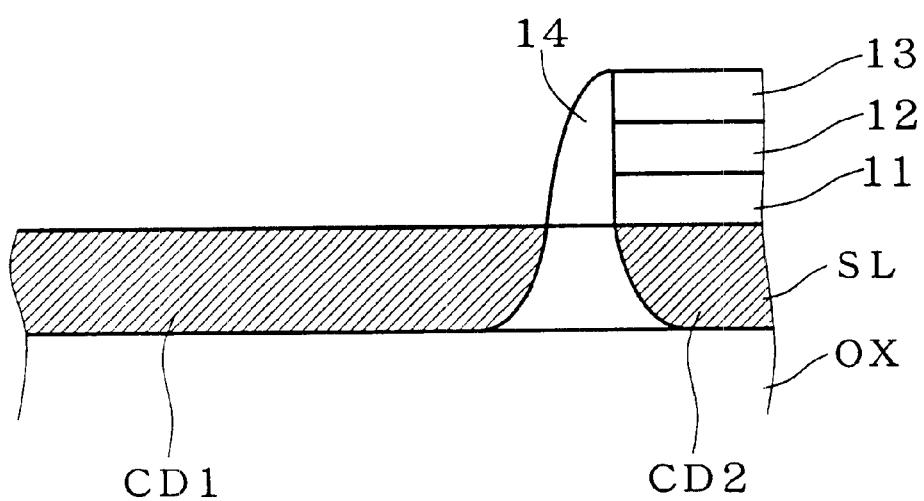

In the step of FIG. 41, a resist mask R41 is formed in the NMOS transistor formation region NR and an source/drain is injected into the SOI layer SL of the PMOS transistor formation region PR. This injection is performed, for example, with boron at an energy of 5 to 20 KeV at a dose of $1\times10^{14}$ to $50\times10^{14}/cm^2$.

Subsequently, in the step of FIG. 42, a salicide process is performed, where the salicide films 223, 233 and 323 are formed on the gate electrodes 220 and 230 and on the surface of the SOI layer SL. These salicide films 223, 233 and 323 may be any of cobalt silicide, titanium silicide, tungsten silicide or the like.

After that, the interlayer insulating film 930 is formed on the NMOS transistor formation region NR and the PMOS transistor formation region PR, the contact holes 520 and 530 are formed and wires mainly made of aluminum are placed, to obtain the CMOS transistor shown in FIGS. 25 and 26.

<4-3. Superimposition Check Mark>

The use of the superimposition check marks MK1 and MK2 will be discussed below with reference to FIG. 43.

FIG. 43 is an enlarged view of the superimposition check marks MK1 and MK2 of FIG. 25, seen from the upper direction in the step of FIG. 31.

In FIG. 43, the FS gate electrode multi-layered elements FG like the FS gate electrodes 120 and 130 are formed on the superimposition check marks MK1 and MK2.

The FS gate electrode multi-layered element FG is similar in two-dimensional shape to each of the superimposition check marks MK1 and MK2. This two-dimensional shape reflects the pattern shape of the resist mask used when the FS gate electrodes 120 and 130 are formed.

As the pattern shape of the resist mask used for forming the FS gate electrodes 120 and 130 is a pattern shape of the exposure mask, it can be thought that the pattern shape of the exposure mask is projected on each of the superimposition check marks MK1 and MK2 in FIG. 43.

The spacing Si between two adjacent FS gate electrode multi-layered elements FG (i.e., pattern spacing of the exposure mask) is different from the spacing S2 between two superimposition check marks MK1 or two superimposition check marks MK1. If the exposure mask is deviated, the pattern shapes of the exposure mask in the central superimposition check marks MK1 and MK2 among the respective five ones should be deviated laterally or vertically. Through checking the deviation (e.g., visual check), correction of the deviation between the exposure mask and the object to be irradiated (i.e., the semiconductor substrate) can be performed.

Since the superimposition check marks MK1 and MK2 are used as above, the multi-layered elements like the FS gate electrodes 120 and 130 are formed thereon.

While the invention has been shown and described in detail, the foregoing description is in all aspects illustrative and not restrictive. It is therefore understood that numerous modifications and variations can be devised without departing from the scope of the invention.

We claim:

1. A method for manufacturing a semiconductor device, said semiconductor device comprising a field-shield isolation structure for electrically isolating MOS transistors, and said field-shield isolation structure including a field-shield oxide film formed on a semiconductor substrate; and a field-shield gate electrode formed on said field-shield oxide film, said method comprising the steps of:
- (a) preparing said semiconductor substrate;
- (b) selectively forming said field-shield oxide film and said field-shield gate electrode on said walls of said semiconductor substrate and thereafter forming side wall oxide films on side walls of said field-shield gate electrode; and
- (c) forming a sacrifice oxide film on an exposed surface of said semiconductor substrate and removing said sacrifice oxide film.

2. The method of claim 1, wherein said step (a) is the step of preparing an SOI substrate having an SOI layer formed on an insulating substrate, and said field-shield oxide film and said sacrifice oxide film are formed on said SOI layer.

3. The method of claim 2, wherein said step (a) includes the step of performing ion injection with an impurity of a first conductivity type into said SOI layer so that said impurity of the first conductivity type has a first concentration, and said step (c) includes the step of
- (c-1) performing ion infection, after forming said sacrifice oxide film, with an impurity of a second conductivity type into said SOI layer through said sacrifice oxide film so that said impurity of the second conductivity type has a second concentration which is lower than said first concentration.

4. The method of claim 2, wherein said step (a) includes the step of performing ion injection with an impurity of a first conductivity type into said SOI layer so that said impurity of the first conductivity type has a first concentration, and
- (b-1) performing ion injection, before forming said side wall oxide films, with an impurity of a second conductivity type into said SOI layer by using said field-shield gate electrode as a mask so that said impurity of the second conductivity type has a second concentration which is lower than said first concentration.

5. The method of claim 4, wherein said step (b) includes the steps of
- (b-2) entirely forming said field-shield oxide film and said field-shield gate electrode, and
- (b-3) selectively removing said field-shield gate electrode, and wherein said steps (b-2) and (b-3) are performed before said step (b-1).

6. The method of claim 1, further comprising the step of:

selectively forming an LOCOS oxide layer at a predetermined position on a surface of said semiconductor substrate before the step of (b), wherein said step (b) includes the step of
- (b-4) forming a resist mask on said field-shield oxide film and said field-shield gate electrode and selectively removing said field-shield oxide film and said field-shield gate electrode by etching, and wherein said LOCOS oxide layer is used as a superimposition check mark in forming said resist mask.

7. The method of claim 1, wherein said step (b) includes the steps of
- (b-5) forming a first insulating film with resistance to oxidation so as to be interposed between said field-shield oxide film and said field-shield gate electrode; and
- (b-6) forming a second insulating film with resistance to oxidation directly on said field-shield gate electrode.

8. The method of claim 1, wherein said field-shield oxide film is formed by CVD.

9. The method of claim 1, comprising:

removing said field-shield oxide film to expose a portion of said substrate adjacent to at least one of said side wall oxide films; and forming said sacrifice oxide film on said portion.

10. The method of claim 9, comprising:

removing said sacrifice oxide from said portion and forming a gate oxide film on said portion.

11. The method of claim 1, comprising:

forming said field-shield oxide film thicker under said sidewall oxide films than under said field-shield gate electrode.

* * * * *